(12) United States Patent
Kang et al.

(10) Patent No.: US 8,404,542 B2
(45) Date of Patent: Mar. 26, 2013

(54) SEMICONDUCTOR DEVICE HAVING TRANSISTOR WITH VERTICAL GATE ELECTRODE AND METHOD OF FABRICATING THE SAME

(75) Inventors: Sang-Woo Kang, Seoul (KR); Jeong-Uk Han, Suwon-si (KR); Yong-Tae Kim, Gyeonggi-do (KR); Seung-Beom Yoon, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 2 days.

(21) Appl. No.: 13/075,778

(22) Filed: Mar. 30, 2011

(65) Prior Publication Data

US 2011/0175153 A1 Jul. 21, 2011

Related U.S. Application Data

(62) Division of application No. 11/344,560, filed on Jan. 31, 2006, now Pat. No. 7,936,003.

(30) Foreign Application Priority Data

Feb. 3, 2005 (KR) .................. 10-2005-0010056
Jul. 21, 2005 (KR) .................. 10-2005-0066383

(51) Int. Cl.
*H01L 21/336* (2006.01)
(52) U.S. Cl. ........ 438/264; 438/266; 438/248; 438/391; 257/315; 257/316; 257/E21.422
(58) Field of Classification Search ................. 438/264, 438/266, 248, 391; 257/315, 316, E21.422, 257/E29.3
See application file for complete search history.

(56) References Cited

U.S. PATENT DOCUMENTS 6,239,465 B1 * 5/2001 Nakagawa .................... 257/331

* cited by examiner

*Primary Examiner* — Thinh T Nguyen
(74) *Attorney, Agent, or Firm* — F. Chau & Associates, LLC

(57) ABSTRACT

A semiconductor device includes transistors with a vertical gate electrode. In a transistor structure, a semiconductor pattern has first and second sides facing in a transverse direction, and third and fourth sides facing in a longitudinal direction. Gate patterns are disposed adjacent to the first and second sides of the semiconductor pattern. Impurity patterns directly contact the third and fourth sides of the semiconductor pattern. A gate insulating pattern is interposed between the gate patterns and the semiconductor pattern.

19 Claims, 24 Drawing Sheets

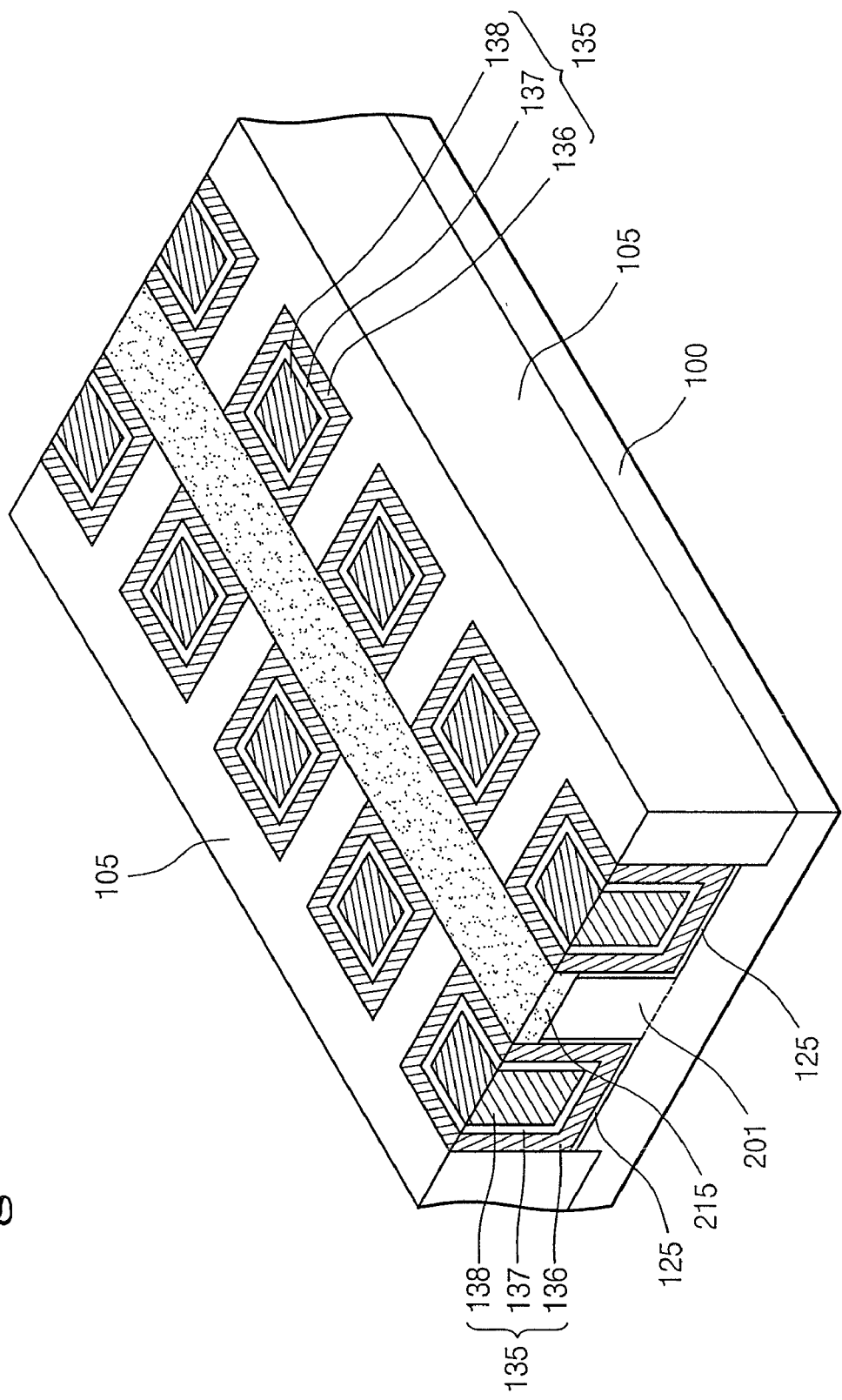

SEMICONDUCTOR DEVICE HAVING TRANSISTOR WITH VERTICAL GATE ELECTRODE AND METHOD OF FABRICATING THE SAME

CROSS-REFERENCE TO RELATED APPLICATIONS

This U.S. non-provisional patent application is a divisional application of U.S. patent application Ser. No. 11/344,560, filed Jan. 31, 2006, now U.S. Pat. No. 7,936,003, which claims priority under 35 U.S.C. §119 to Korean Patent Applications 2005-10056 filed on 3 Feb. 2005 and 2005-66383 filed 21 Jul. 2005, herein incorporated by reference in its entirety.

BACKGROUND OF THE INVENTION

1. Field of the Invention

The present invention relates to a semiconductor device and a method of fabricating the same, and more particularly, to a semiconductor device having a transistor with a vertical gate electrode, and a method of fabricating the same.

2. Discussion of Related Art

Semiconductor device integration has followed Moore's law or Hwang's law, which are observations that a degree of integration of semiconductor devices tends to double every 18 months or 1 year. These observations are expected to hold true into the future. To continue increasing the degree of integration, a planar area occupied by electronic elements of the semiconductor devices needs to be reduced. This reduction is restricted by the various characteristics that the electronic elements need to satisfy.

Regarding metal-oxide-semiconductor (MOS) transistors, a short channel effect is a typical restriction associated with the reduction of integration. The short channel effect occurs as a channel length of a transistor (e.g., a distance between a source electrode and a drain electrode) becomes narrower. The short channel effect degrades the characteristic of transistors, similar to a punch-through, a drain induced barrier lowering (DIBL), and a subthreshold swing. In addition, the reduction in the channel length of the transistor causes an increase of a parasitic capacitance between a substrate and source/drain electrodes, the increase of a leakage current, etc. Due to these problems, the reduction in the channel length of the transistor is restricted.

In the case of a planar MOS transistor, the degree of integration of a semiconductor device can be increased by reducing a channel width of a transistor. A channel width (W) is proportional to a drain current ($I_d$) as given by equation (1), and the reduction of the channel width will decrease a current driving capability of the transistor.

$$I_d = \frac{W}{L} f(V_G, V_T, V_{DS}) \qquad (1)$$

where L is a channel length.

Flash memory includes a gate insulating layer of a uniform thickness between a floating gate electrode and a semiconductor substrate. Due to the uniform thickness of the gate insulating layer, read and write operational characteristics of the flash memory may be limited. For example, the thickness of the gate insulating layer may be increased so as to increase an information storage capacity, however the read and write operational characteristics are negatively effected by the increased thickness of the gate insulating layer. Accordingly, the thickness of the gate insulating layer is selected to balance the storage capacity and read and write characteristics. A unit cell of a nonvolatile memory device, such as an EEPROM, includes a select transistor and a cell transistor to substantially overcome this limitation. However, since the unit cell of the EEPROM has two transistors, an area of the unit cell is increased.

In the conventional planar MOS transistor, a tradeoff relationship exists between the improvement of the characteristics of the transistor and the increase of the degree of integration thereof. Accordingly, there is a demand for a transistor structure that can satisfy the two technical needs of improved device performance and increased integration.

SUMMARY OF THE INVENTION

According to an embodiment of the present invention, a transistor structure comprises gate patterns on at least two sides of a semiconductor pattern used as a channel region. The transistor structure comprises a semiconductor pattern, gate patterns, impurity patterns and a gate insulating layer. The semiconductor pattern has first and second sides facing in a transverse direction, and third and fourth sides facing in a longitudinal direction. The gate patterns are disposed adjacent to the first and second sides of the semiconductor pattern. Each impurity pattern directly contacts the third or fourth sides of the semiconductor pattern. The gate insulating pattern is interposed between the gate patterns and the semiconductor pattern.

The gate pattern includes a control gate pattern, a floating gate pattern, and a gate interlayer insulating pattern interposed therebetween, thereby forming a gate structure of a flash memory. An electric signal applied to the control gate pattern varies an electric potential of the semiconductor pattern. The floating gate pattern is interposed between the control gate pattern and the gate insulating layer, so that it is electrically floating.

According to another embodiment of the present invention, a semiconductor device comprises gate patterns on at least two sides of a channel. This semiconductor device comprises an active pattern, gate patterns, device isolation patterns and a gate insulating pattern. The active pattern is disposed in a predetermined region of a semiconductor substrate, and includes channel regions and connection regions arranged between the channel regions. The gate patterns are disposed on the at least two sides of the channel region, and the device isolation patterns are disposed on the at least two sides of the connection region to separate the gate patterns. The gate insulating pattern is interposed between the gate pattern and the semiconductor substrate and between the gate pattern and the active pattern. Source/drain electrodes are formed in the connection regions. The gate patterns are connected together by a lower interconnection.

According to another embodiment of the present invention, the gate pattern is formed of at least one material selected from a group consisting of polysilicon, copper, aluminum, tungsten, tantalum, titanium, tungsten nitride, tantalum nitride, titanium nitride, tungsten silicide, and cobalt silicide. The gate insulating pattern is formed of at least one layer selected from a group consisting of a silicon oxide layer, a silicon nitride layer, and a high-k dielectric layer. Preferably, the gate insulating pattern is extended between the gate pattern and the device isolation pattern.

According to an embodiment of the present invention, the semiconductor device further includes an upper interconnection crossing the lower interconnection and connecting the source/drain electrodes. The upper interconnection includes contact plugs connected to the source/drain electrodes.

According to still another embodiment of the present invention, the upper interconnection crosses the lower interconnection and connects a first group of the source/drain electrodes, and a data storage structure can be electrically connected to a second group of the source/drain electrodes that are not connected by the upper interconnections. The data storage structure may be one of a DRAM capacitor, a magnetic tunnel junction (MTJ), a ferroelectric capacitor, and a phase-change resistor.

According to an embodiment of the present invention, a method of fabricating a semiconductor device having gate patterns on both sides of a channel region comprises forming device isolation patterns in a predetermined region of a semiconductor substrate to form an auxiliary active pattern including a plurality of channel regions, connection regions disposed between the channel regions, and gate regions disposed on at least two sides of the channel regions. Active patterns, constituted by the channel regions and the connection regions, are formed by recessing the gate regions of the auxiliary active pattern such that top surfaces of the gate regions are lower than the channel regions. A gate insulating layer is formed to cover the semiconductor substrate exposed by recessed gate regions, and gate patterns are formed to fill the recessed gate regions covered with the gate insulating layer. Source/drain electrodes are formed in the connection regions of the active patterns.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 4A to 10A are plan views illustrating a process of fabricating a semiconductor device according to some embodiments of the present invention;

FIGS. 4B to 10B are perspective views illustrating a process of fabricating a semiconductor device according to the embodiments of the present invention;

DETAILED DESCRIPTION OF PREFERRED EMBODIMENTS

Reference will now be made in detail to preferred embodiments of the present invention, examples of which are illustrated in the accompanying drawings. However, the present invention is not limited to embodiments illustrated herein after, and embodiments herein are rather introduced to provide easy and complete understanding of the scope and spirit of the present invention.

Figure 1A:
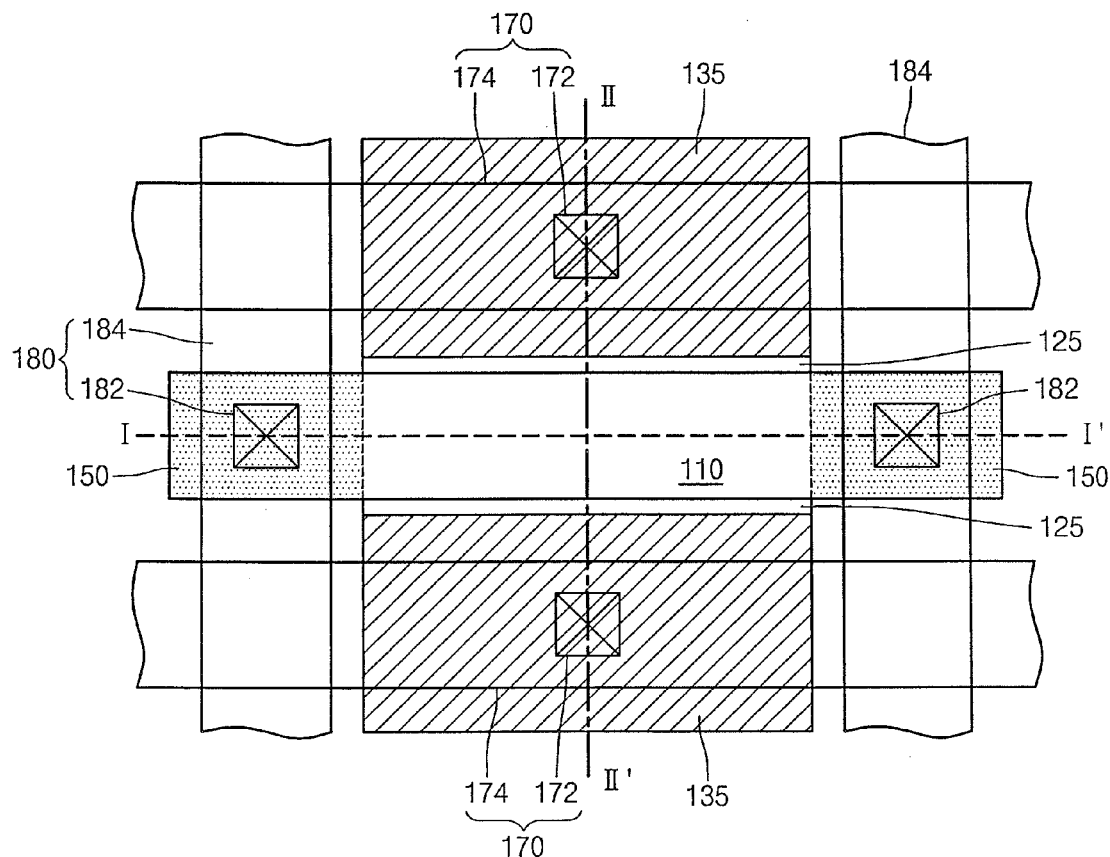
FIG. 1A is a plan view of a semiconductor device according to an embodiment of the present invention.
Figure 1B:
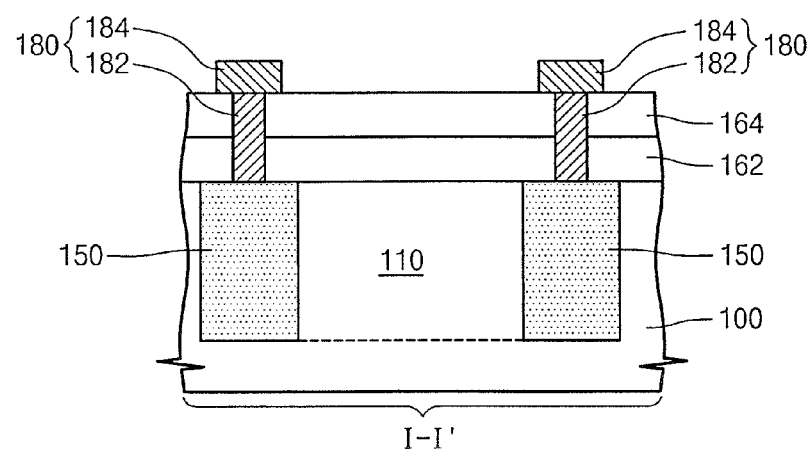
FIGS. 1B and 1C are sectional views illustrating a process of fabricating the semiconductor device illustrated in FIG. 1A.
Figure 1C:
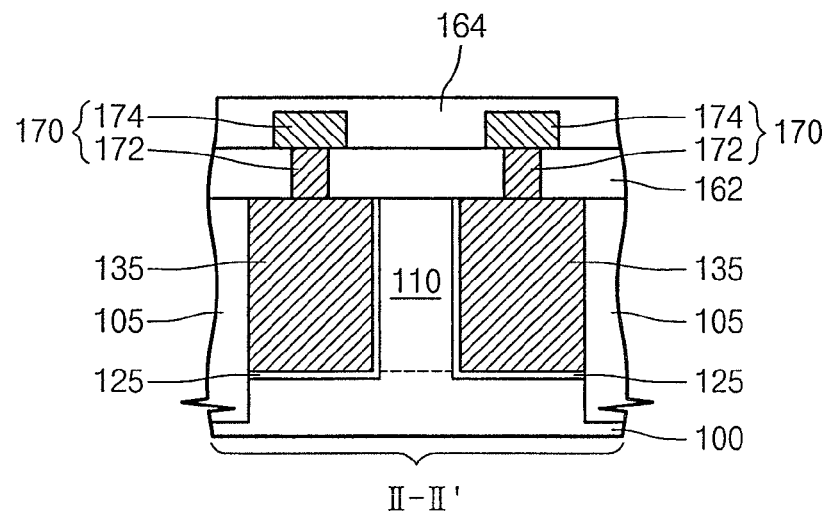

FIG. 1A is a plan view illustrating a transistor structure of a semiconductor device according to an embodiment of the present invention, and FIGS. 1B and 1C are sectional views illustrating a process of fabricating the semiconductor device illustrated in FIG. 1A. Specifically, FIGS. 1B and 1C are sectional views taken along lines I-I' and II-II' in FIG. 1A, respectively.

Referring to FIGS. 1A to 1C, a semiconductor pattern 110 is a channel region of a transistor formed in a predetermined region of a semiconductor substrate 100. The semiconductor pattern 110 is formed of a semiconductor material (e.g., silicon) having a conductivity type the same as that of the semiconductor substrate 100.

Figure 2:
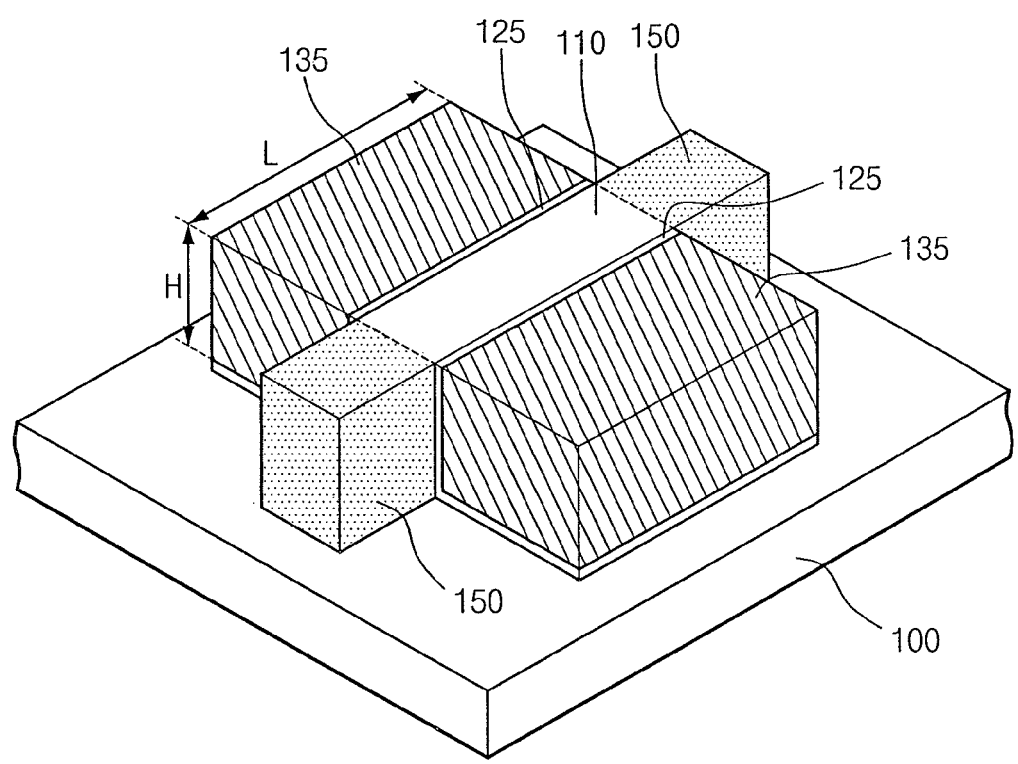
FIG. 2 is a perspective view of a transistor structure of a semiconductor device according to a preferred embodiment of the present invention.

It is preferable that the semiconductor pattern 110 is a rectangular box having first to fourth sides, a top face, and a bottom face (refer to FIG. 2). The bottom face of the semiconductor pattern 110 directly contacts the semiconductor substrate 100. The first side and the second side oppose each other in a first direction, and the third side and the fourth side oppose each other in a second direction perpendicular to the first direction.

Impurity patterns 150 are disposed on two sides (e.g., the first and second sides) of the semiconductor pattern 110. Gate patterns 135 are disposed on another two sides (e.g., the third and fourth sides) of the semiconductor pattern 110. The impurity patterns 150 are source/drain electrodes of the transistor. The impurity patterns 150 are disposed to directly contact the semiconductor pattern 110. The impurity patterns 150 contain impurities having a different conductivity type from that of the semiconductor pattern 110 and the semiconductor substrate 100.

The gate patterns 135 are gate electrodes for controlling an electric potential of the semiconductor pattern 110. A gate insulating pattern 125 is interposed between the gate pattern 135 and the semiconductor pattern 110. The gate insulating pattern 125 extends between and separates the gate pattern 135 and the semiconductor substrate 100. The gate pattern 135 can be formed of, for example, copper, aluminum, tungsten, tantalum, titanium, tungsten nitride, tantalum nitride, titanium nitride, tungsten silicide, or cobalt silicide. In addition, the gate insulating pattern 125 can be formed of, for example, a silicon oxide layer, a silicon nitride layer, or a high-k dielectric layer.

Figure 10A:
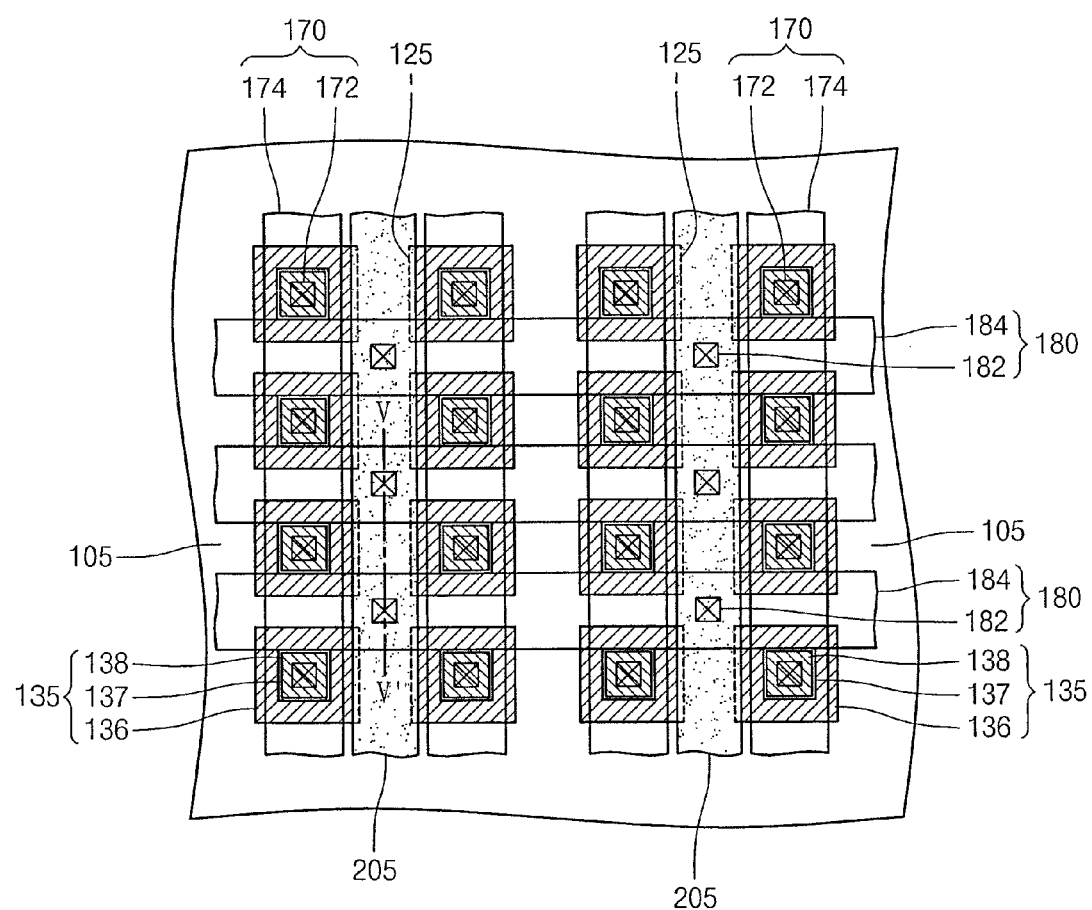
Figure 10B:
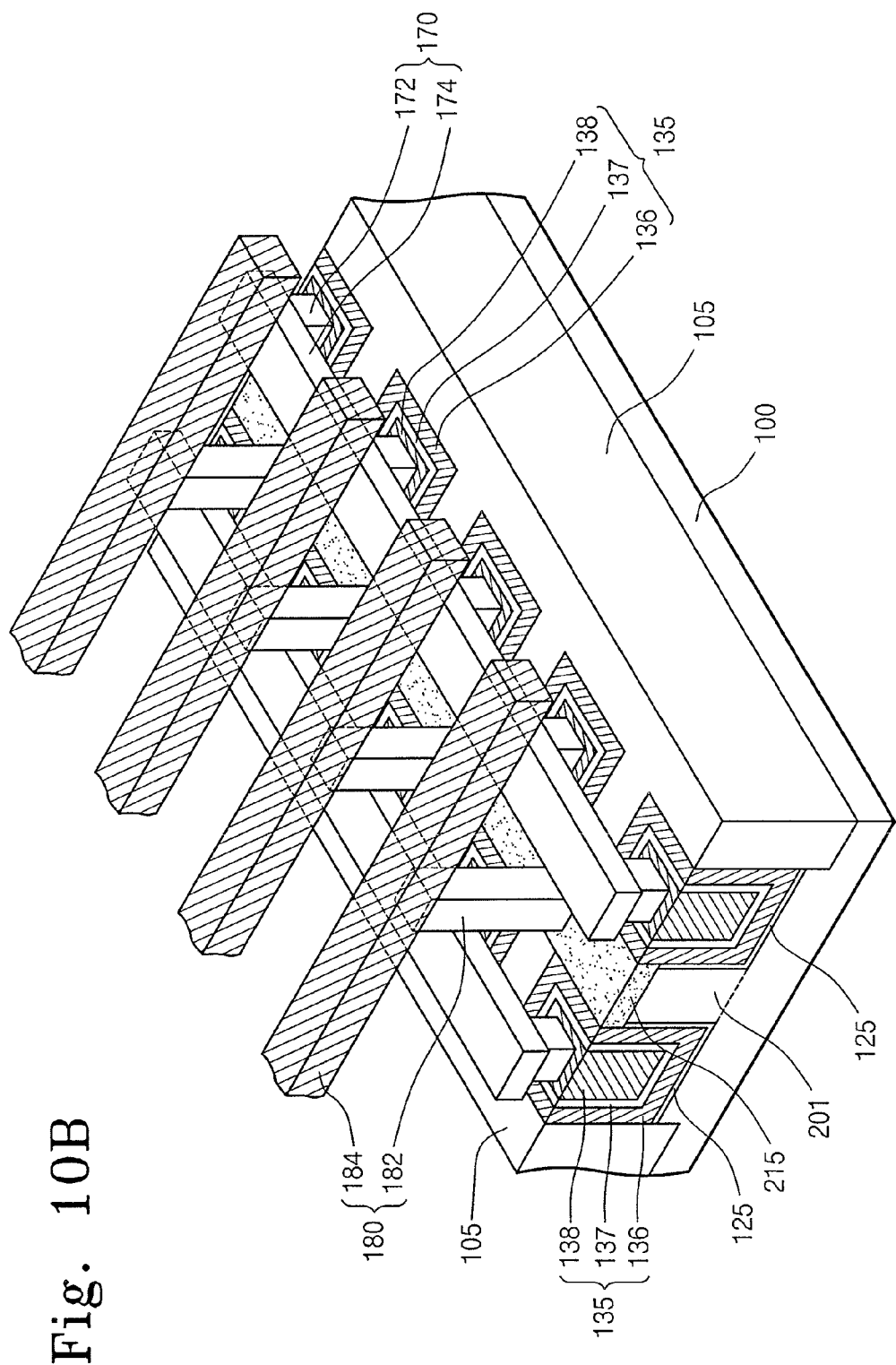

Each semiconductor pattern 110 corresponds to a channel region shared by two transistors. A pair of the impurity patterns 150 disposed on both sides of each semiconductor pattern 110 corresponds to the source/drain electrodes shared by the two transistors. A pair of transistors formed adjacent to the semiconductor pattern 110 shares the same semiconductor pattern 110 and the impurity patterns 150 as the channel region and the source/drain electrodes. Where the semiconductor pattern 110 and the impurity patterns 150 are shared by two transistors, the number of transistors per unit area can be increased. As illustrated in FIGS. 10A and 10B, one impurity region, which forms the source/drain electrodes, can be shared by four transistors. The gate electrode of the MOS transistor according to an embodiment of the present invention is disposed on the side of the semiconductor pattern 110. A height of the semiconductor pattern 110, the gate patterns 135, and the impurity patterns 150 are substantially equal. The gate patterns 135 and the impurity patterns 150 have a substantially equal thickness; the thickness difference between the gate patterns 135 and the impurity patterns 150 is less than 20% of the thickness of the gate patterns 135 or the impurity patterns 150.

The gate patterns 135 are connected to gate lines 174, to which a gate voltage is applied, through gate plugs 172. The impurity patterns 150 are connected to source/drain lines 184, to which a ground voltage or a signal voltage is applied, through contact plugs 182. Preferably, the gate plug 172 and the gate line 174 constitute a lower interconnection 170 disposed below the source/drain lines 184. The contact plug 182 and the source/drain lines 184 constitute an upper interconnection 180.

A lower interlayer insulating layer 162 and an upper interlayer insulating layer 164 are sequentially disposed on the gate patterns 135 and the impurity patterns 150. The lower interlayer insulating layer 162 and the upper interlayer insulating layer 164 structurally support the gate lines 174 and the source/drain lines 184 and electrically insulate them. The gate plugs 172 penetrate the lower interlayer insulating layer 162 such that they are connected to the gate patterns 135. The contact plugs 182 penetrate the upper interlayer insulating layer 164 and the lower interlayer insulating layer 162 such that they are connected to the impurity patterns 150.

According to an embodiment of the present invention, two gate patterns 135 formed adjacent to one semiconductor pattern 110 are connected to different lower interconnections 170 (refer to FIG. 1A), respectively. In a similar manner, two impurity patterns 150 formed adjacent to one semiconductor pattern 110 are connected to different upper interconnections 180, respectively.

The transistor structure according to an embodiment of the present invention can be applied to cell transistors of a floating-gate type flash memory. In the floating-gate type flash memory the gate pattern 135 can be formed in a stack structure of a floating gate pattern 136, a gate interlayer insulating pattern 137, and a control gate pattern 138 (refer to FIGS. 10A and 10B). The lower interconnection 170 is electrically connected to the control gate pattern 138, and the floating gate pattern 136 is electrically floated. The floating gate pattern 136 is spaced apart from the semiconductor pattern 110 and the semiconductor substrate 100 by the gate insulating pattern 125. The floating gate pattern 136 is spaced apart from the control gate pattern 138 by the gate interlayer insulating pattern 137.

The transistor structure according to an embodiment of the present invention can be applied to a floating-trap type flash memory. In the floating-trap type flash memory, the gate insulating pattern 125 can be formed of an insulating layer including a silicon nitride layer. Preferably, the gate insulating pattern 125 may be formed in a stack structure of a silicon oxide layer, a silicon nitride layer, and a silicon oxide layer. Embodiments applied to the flash memory are described in more detail with reference to FIGS. 4 to 10.

Figure 3A:
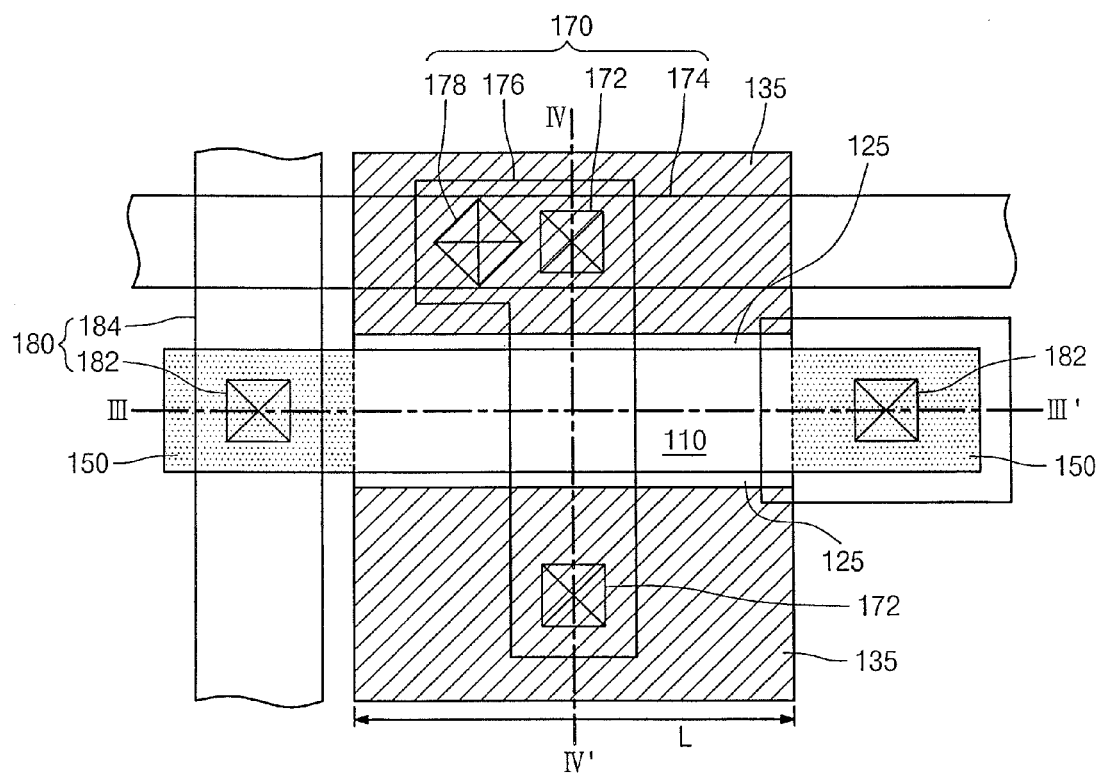
FIG. 3A is a plan view of a semiconductor device according to another embodiment of the present invention.
Figure 3B:
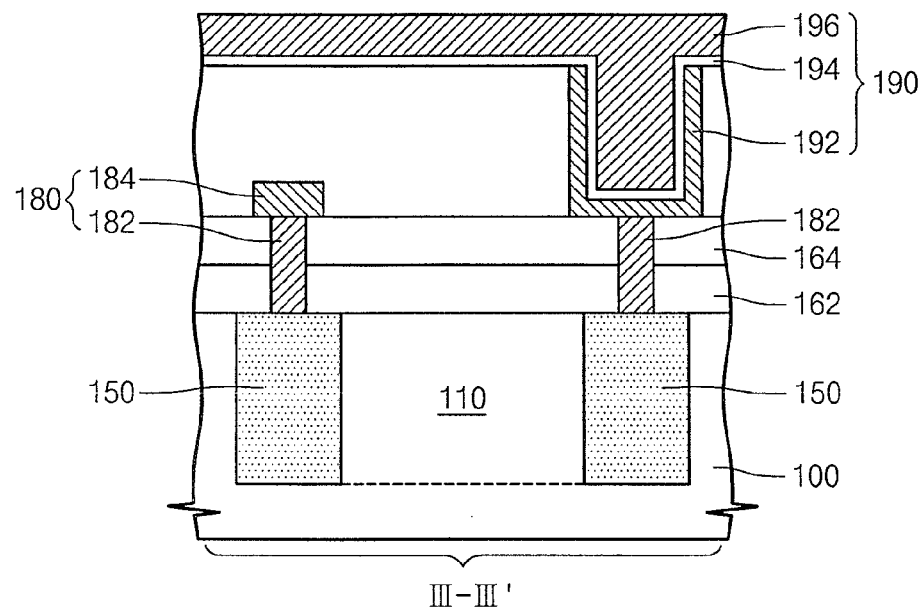
FIGS. 3B and 3C are sectional views illustrating a process of fabricating the semiconductor device illustrated in FIG. 3A.
Figure 3C:
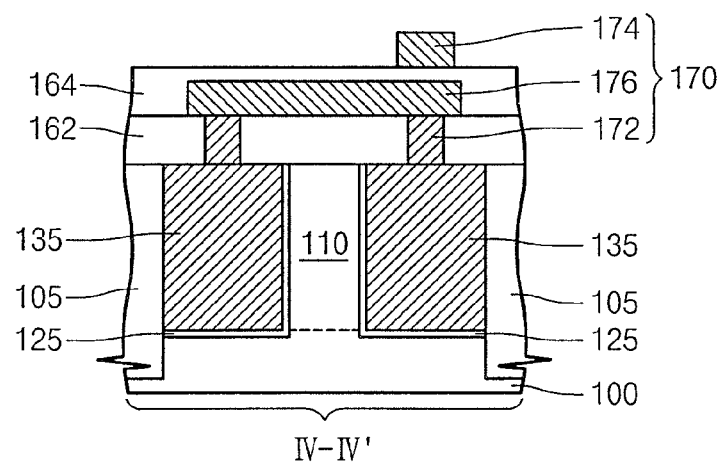

The structures of the lower interconnection 170 and the upper interconnection 180 can be modified from that shown in, for example, FIG. 1A. FIG. 3A is a plan view of a semiconductor device with an interconnection structure according to another embodiment of the present invention, and FIGS. 3B and 3C are sectional views taken along lines III-III' and IV-IV', showing a process of fabricating the semiconductor device illustrated in FIG. 3A. The structure of FIG. 3A is similar to the structure of FIG. 1A, except that the interconnection structure has been modified. Duplicative description is omitted from the description of FIGS. 3A, 3B and 3C.

Referring to FIGS. 3A, 3B and 3C, two gate patterns 135 formed adjacent to one semiconductor pattern 110 are connected together by a local interconnection 176 crossing the semiconductor pattern 110 (refer to FIG. 3C). The local interconnection 176 is connected to a gate line 174 through an upper gate plug 178 (refer to FIG. 3A).

The same gate voltage is applied to the gate patterns 135 connected together by the local interconnection 176, and one semiconductor pattern 110 forms a channel region of one transistor. A channel width of the transistor according to an embodiment of the present invention is increased compared with that of FIG. 1A.

The channel width of the transistor according to an embodiment of the present invention corresponds to a height H in FIG. 2 of the gate pattern 135 contacting with the semiconductor pattern 110. If the gate patterns 135 are connected by the local interconnection 176, an area of the gate pattern 135 contacting with the channel region is about two times as large as that shown in FIGS. 1A to 1C. Accordingly, the channel width is about two times as large as that shown in FIGS. 1A to 1C. If the channel width of the transistor increases, the current driving capability of the transistor can increase. The channel length of the transistor is a length between the source electrode and the drain electrode. The channel length of the transistor according to an embodiment of the present invention corresponds to a length L in FIG. 2 of the semiconductor pattern 110 or the gate pattern 135. Accordingly, the channel lengths in FIGS. 1A and 3A are substantially equal to each other.

The upper interconnection 180 and a data storage unit 190 are connected to respective impurity patterns 150. As illustrated in FIG. 3B, the data storage unit 190 can be a DRAM cell capacitor including a bottom electrode 192, a top electrode 196, and a dielectric layer 194 interposed therebetween.

The data storage unit 190 can be a magnetic tunnel junction (MTJ), a ferroelectric capacitor, and a phase-change resistor, which are used as a data storage structure in a magnetic random access memory (MRAM), a ferroelectric RAM (Fe-RAM), and a phase-change RAM (PRAM), respectively.

FIGS. 4A, 5A, 6A, 7A, 8A, 9A, and 10A (hereinafter "FIGS. 4A to 10A") are plan views illustrating a process of fabricating a semiconductor device according to embodiments of the present invention, and FIGS. 4B, 5B, 6B, 7B, 8B, 9B, and 10B (hereinafter "FIGS. 4B to 10B") are perspective views illustrating the process of fabricating the semiconductor device according to FIGS. 4A to 10A.

Figure 4A:
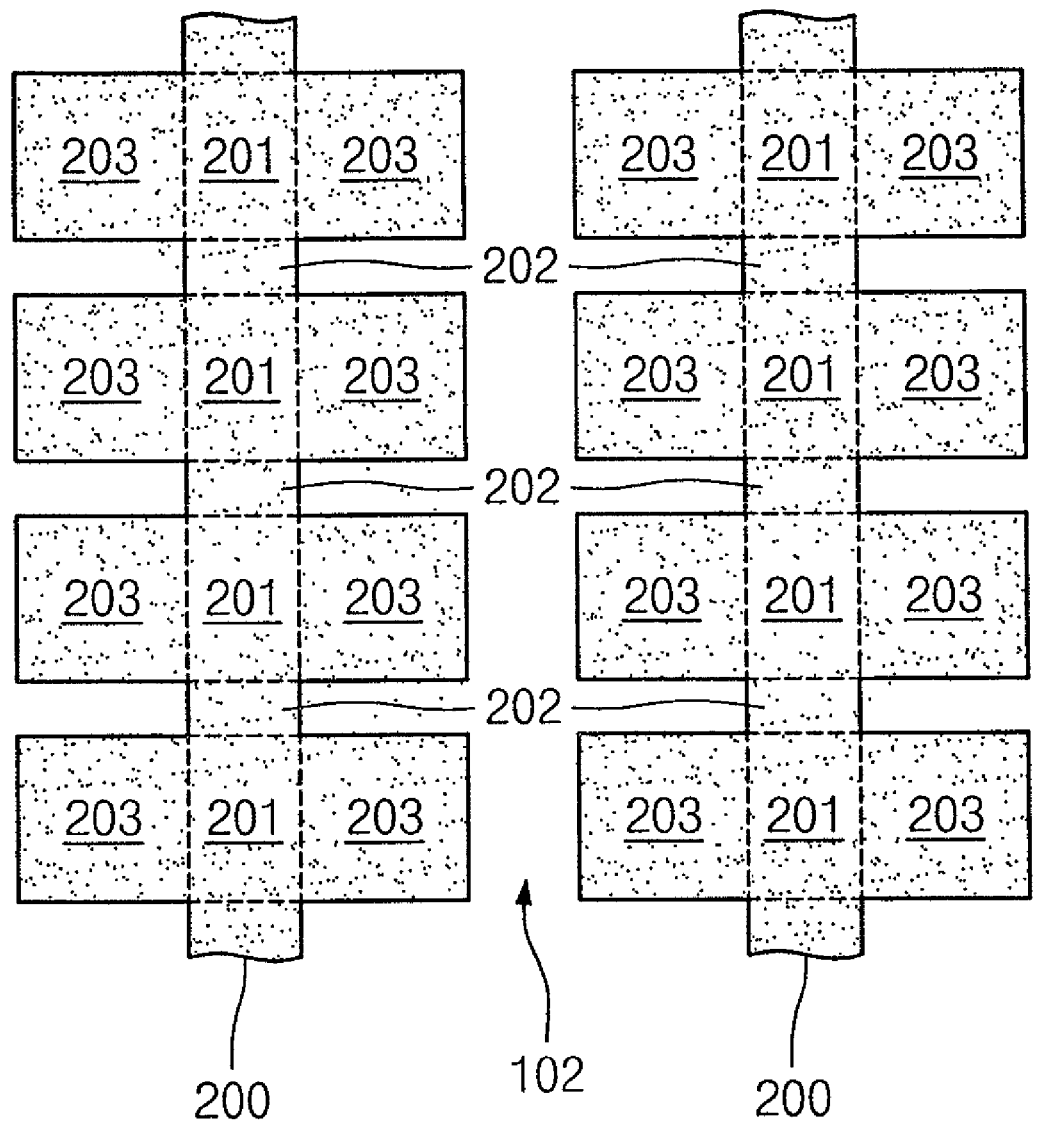
Figure 4B:
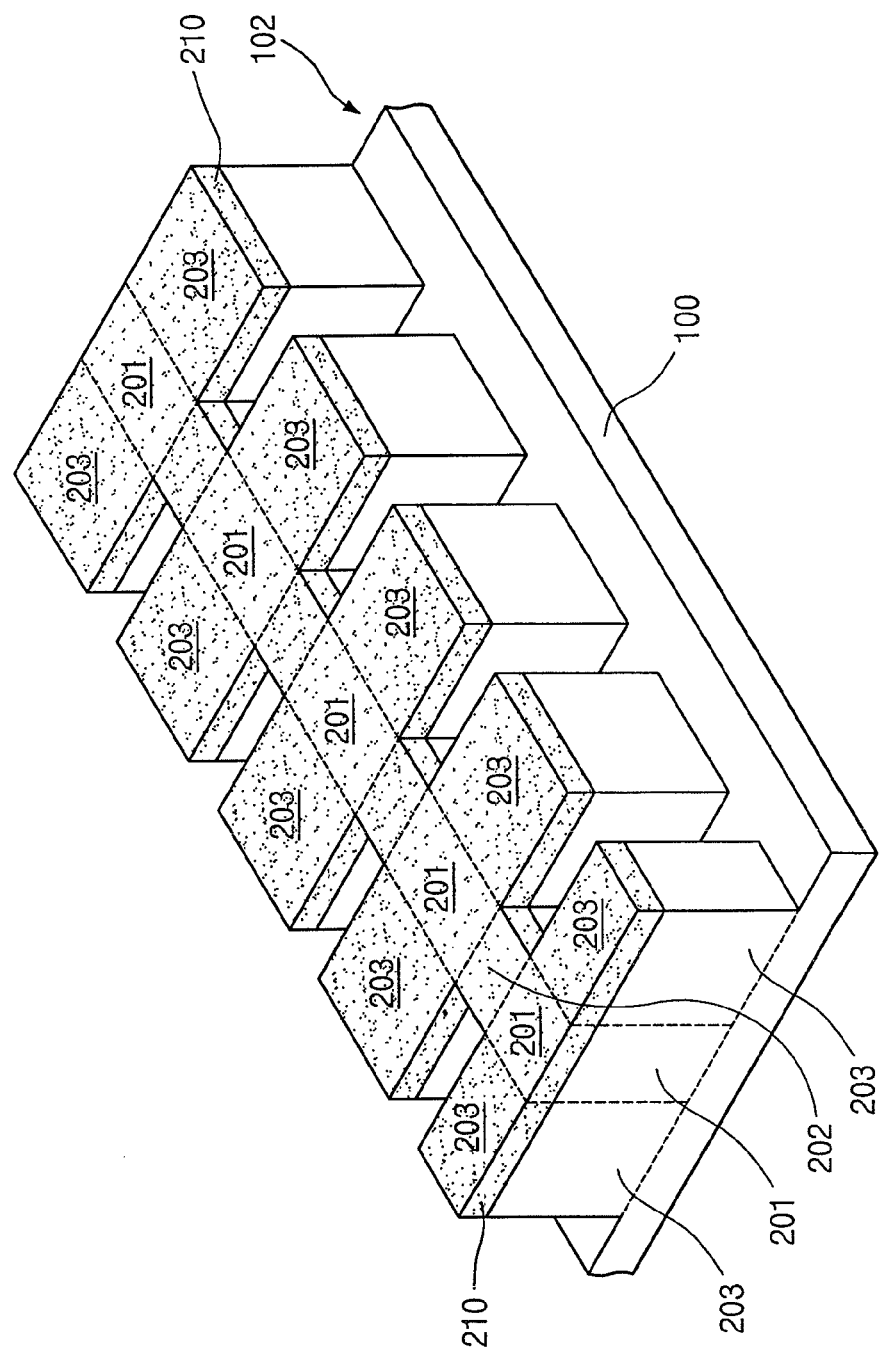

Referring to FIGS. 4A and 4B, a mask layer 210 is formed on a semiconductor substrate 100. The mask layer 210 can be formed of at least one layer, including a silicon oxide layer, a silicon nitride layer, a silicon oxynitride layer, or a polysilicon layer. For example, the mask layer 210 is formed by sequentially stacking a silicon oxide layer and a silicon nitride layer.

The mask layer 210 and the semiconductor substrate 100 are patterned to form a device isolation trench 102 defining an auxiliary active pattern 200. The auxiliary active pattern 200 is a region in which transistors are formed through subsequent processes. The auxiliary active pattern 200 includes a plurality of channel regions 201, a plurality of connection regions 202, and a plurality of gate regions 203. The channel regions 201 are arranged in a first direction (e.g., a longitudinal direction), and the connection regions 202 are arranged between the channel regions 201. The gate regions 203 are arranged at the right and left of the channel regions 201 along a second direction transverse to the first direction.

The device isolation trench 102 is formed by anisotrophic etching, and the mask layer 210 is an etch mask in the etching process. The mask layer 210 may be an etch stop layer in following planarization processes (e.g., refer to FIGS. 5B and 8B). It is preferable that a thickness of the mask layer 210 is determined in consideration of a thickness to be recessed during the etching or planarization processes. The mask layer 210 can be formed to a thickness of about 200 Å to about 3000 Å.

Figure 5A:
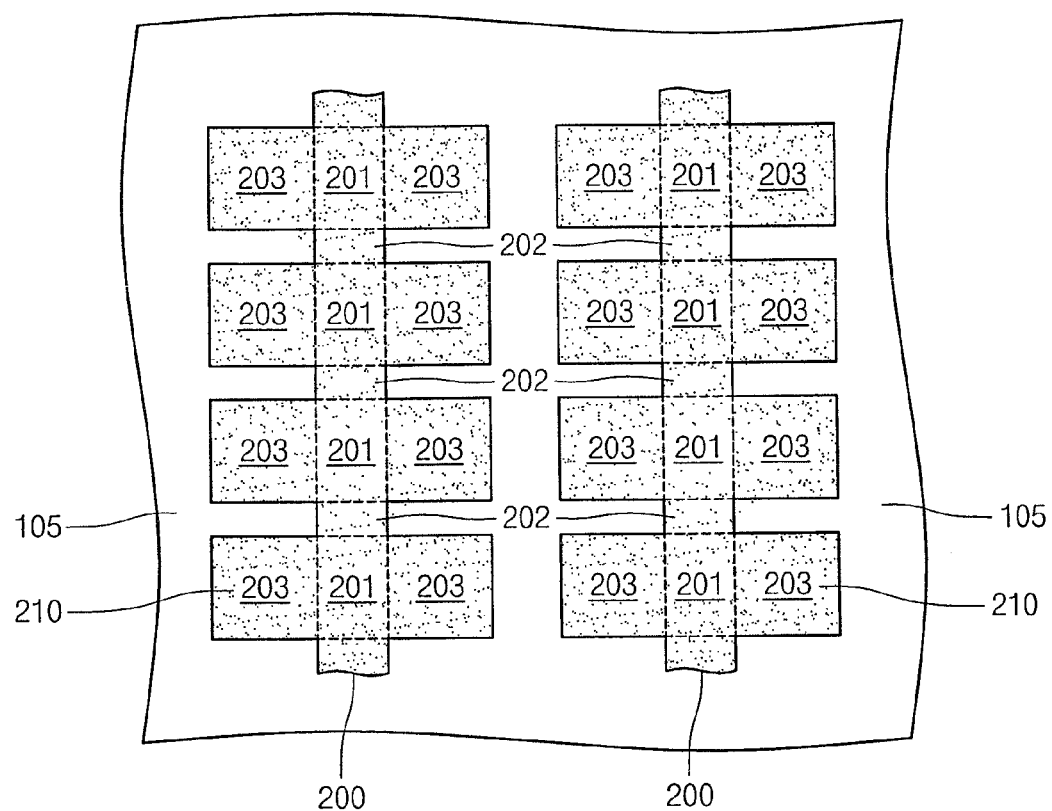
Figure 5B:
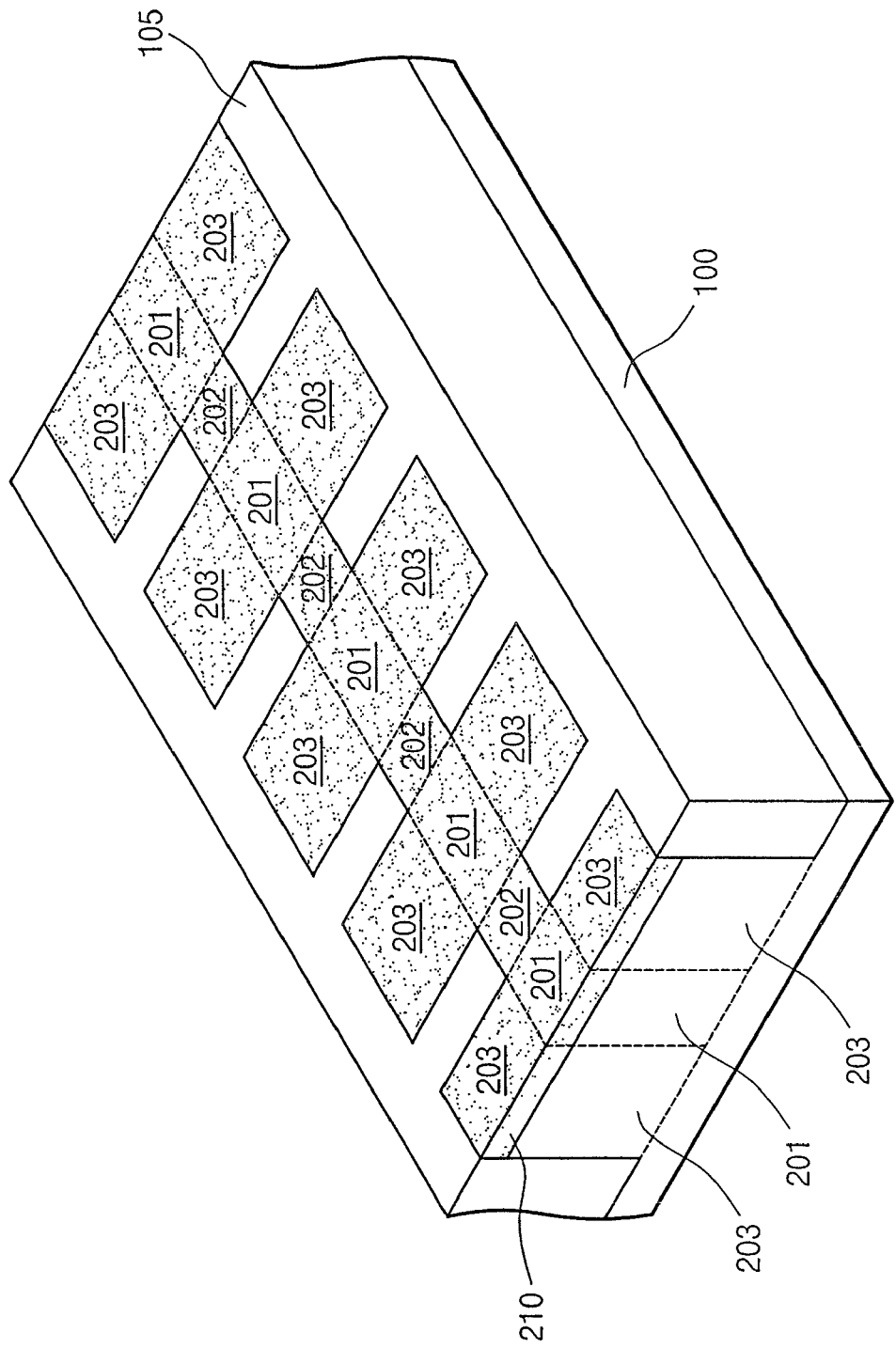

Referring to FIGS. 5A and 5B, a device isolation layer is formed on the resultant structure in which the auxiliary active pattern 200 is formed. The device isolation layer is etched by a planarizing etch process until an upper surface of the mask layer 210 is exposed. Consequently, a device isolation pattern 105 filling the device isolation trench 102 is formed around the auxiliary active pattern 200.

According to an embodiment of the present invention, it is preferable that the device isolation layer is formed of a silicon oxide layer. The device isolation layer can further include a silicon nitride layer, a polysilicon layer, a spin-on-glass (SOG) layer, and so on. To remedy any etching damage caused by the anisotrophic etching, a thermal oxidation process may be performed before forming the device isolation layer. A silicon oxide layer (not shown) is formed on inner walls of the device isolation trench 102 by the thermal oxidation process. Further, to substantially prevent characteristics of the transistor from being changed by penetration of impurities, a diffusion barrier layer (not shown) may be formed before forming the device isolation layer. It is preferable that the diffusion barrier layer is a silicon nitride layer formed by a chemical vapor deposition (CVD) process.

A contacting area between the channel regions 201 and the device isolation layer 105 is substantially prevented. Accordingly, the thermal oxidation process or the formation of the diffusion barrier layer may be optionally omitted.

Figure 6A:
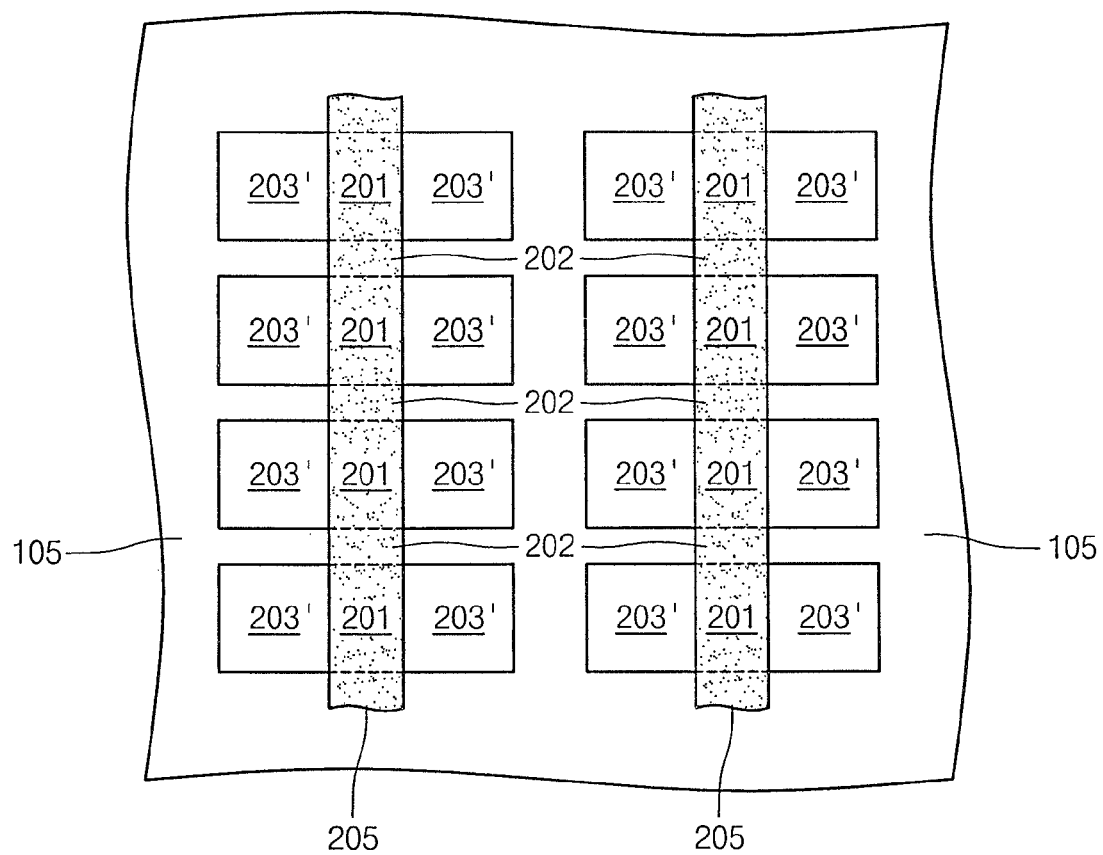
Figure 6B:
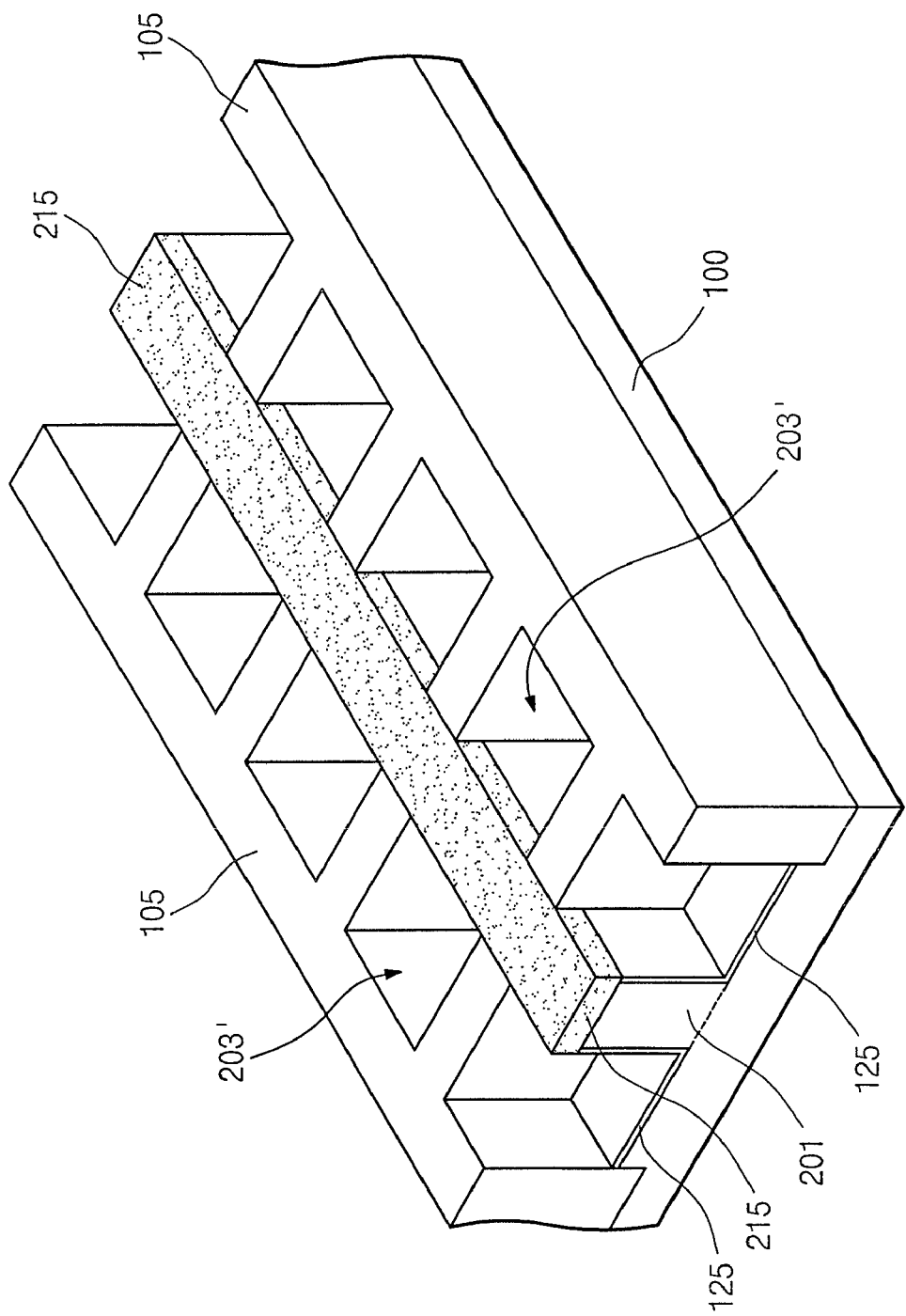

Referring to FIGS. 6A and 6B, a photoresist pattern exposing the gate regions 203 is formed on the auxiliary active pattern 200. The mask layer 210 and the auxiliary active pattern 200 are etched in the exposed gate regions 203 by using the photoresist pattern as an etch mask. An active pattern 205, in which the channel regions 201 and the connection regions 202 are alternately arranged, and a mask pattern 215, which is an etched resultant structure of the mask layer 210, are formed below the photoresist pattern. A recessed gate region 203' is formed between the active pattern 205 and the device isolation layer 105 to expose sidewalls of the channel region 201. The photoresist pattern is removed to expose an upper portion of the mask pattern 215.

A depth of the recessed gate region 203' determines the channel width H of the transistor according to an embodiment of the present invention. The channel width is a process parameter that influences electrical characteristics of the transistor, such as the current driving capability. It is therefore preferable that the channel width is large. According to an embodiment of the present invention, the channel width corresponds to the height of the channel region 201 exposed by the recessed gate region 203'. By increasing the depth of the recessed gate region 203', the channel width of the transistor can be increased without any increase of the cell area.

A gate insulating pattern 125 of the transistor is formed on the semiconductor substrate 100 exposed through the recessed gate region 203'. According to an embodiment of the present invention, the gate insulating pattern 125 may be a silicon oxide layer that is formed by a thermal oxidation process. Using the thermal oxidation process, the gate insulating pattern 125 is formed on an exposed sidewall of the active pattern 205 (i.e., the side of the channel regions 201) and the bottom of the recessed gate region 203'. Any etch damage caused during the etching process of forming the recessed gate region 203' can be remedied by the thermal oxidation process.

Figure 7A:
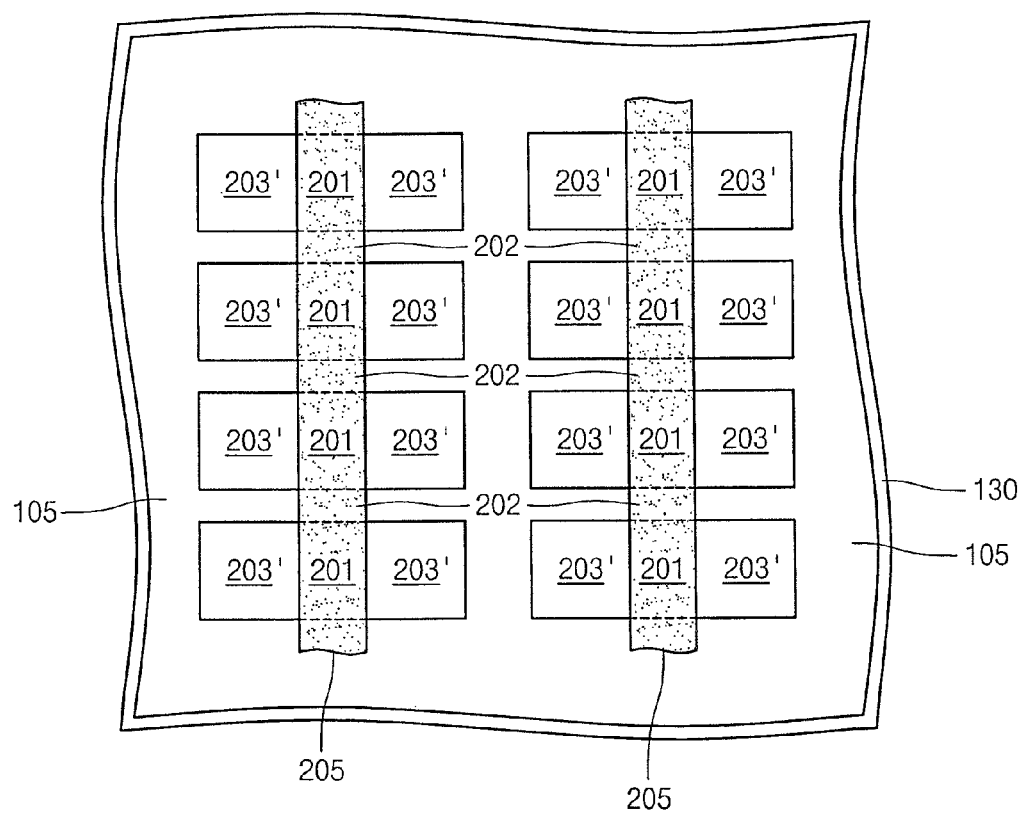
Figure 7B:
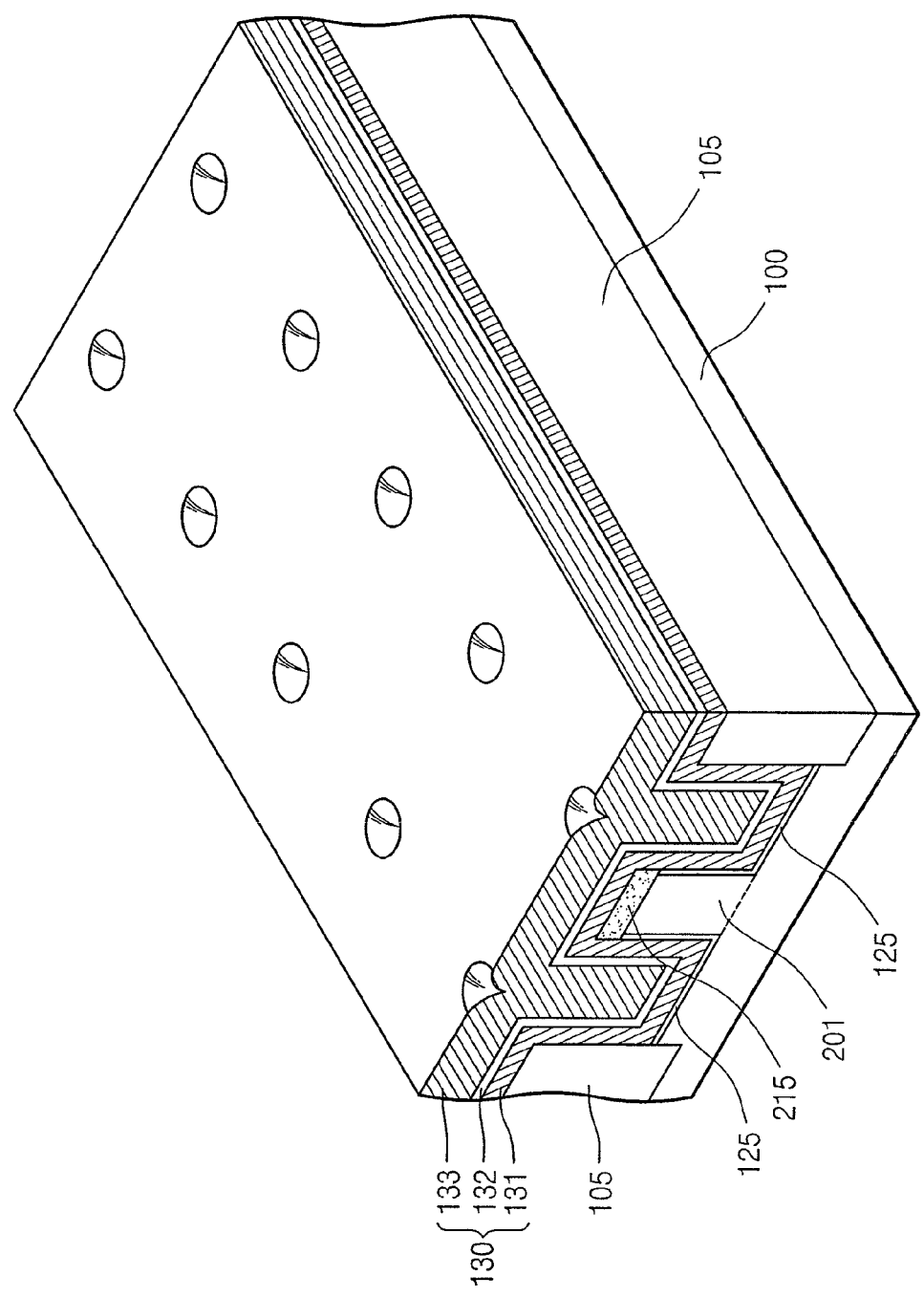

Referring to FIGS. 7A and 7B, a gate conductive layer 130 is formed on the resultant structure in which the gate insulating pattern 125 is formed. The gate conductive layer 130 can be formed of at least material including polysilicon, copper, aluminum, tungsten, tantalum, titanium, tungsten nitride, tantalum nitride, titanium nitride, tungsten silicide, or cobalt silicide. A CVD process can be used to form the gate conductive layer 130. When the gate conductive layer 130 is formed of copper, an electroplating technique can be used.

In a method of fabricating a flash memory according to an embodiment of the present invention, the gate conductive layer 130 can include a floating gate conductive layer 131, a gate interlayer insulating layer 132, and a control gate conductive layer 133, which are stacked in sequence. The floating gate conductive layer 131 and the control gate conductive layer 133 can be formed of polysilicon, and the gate interlayer insulating layer 132 can be formed of an insulating layer including a silicon nitride layer. Preferably, the gate interlayer insulating layer 132 can be formed in a stack structure of a silicon oxide layer, a silicon nitride layer, and a silicon oxide layer.

Figure 8A:
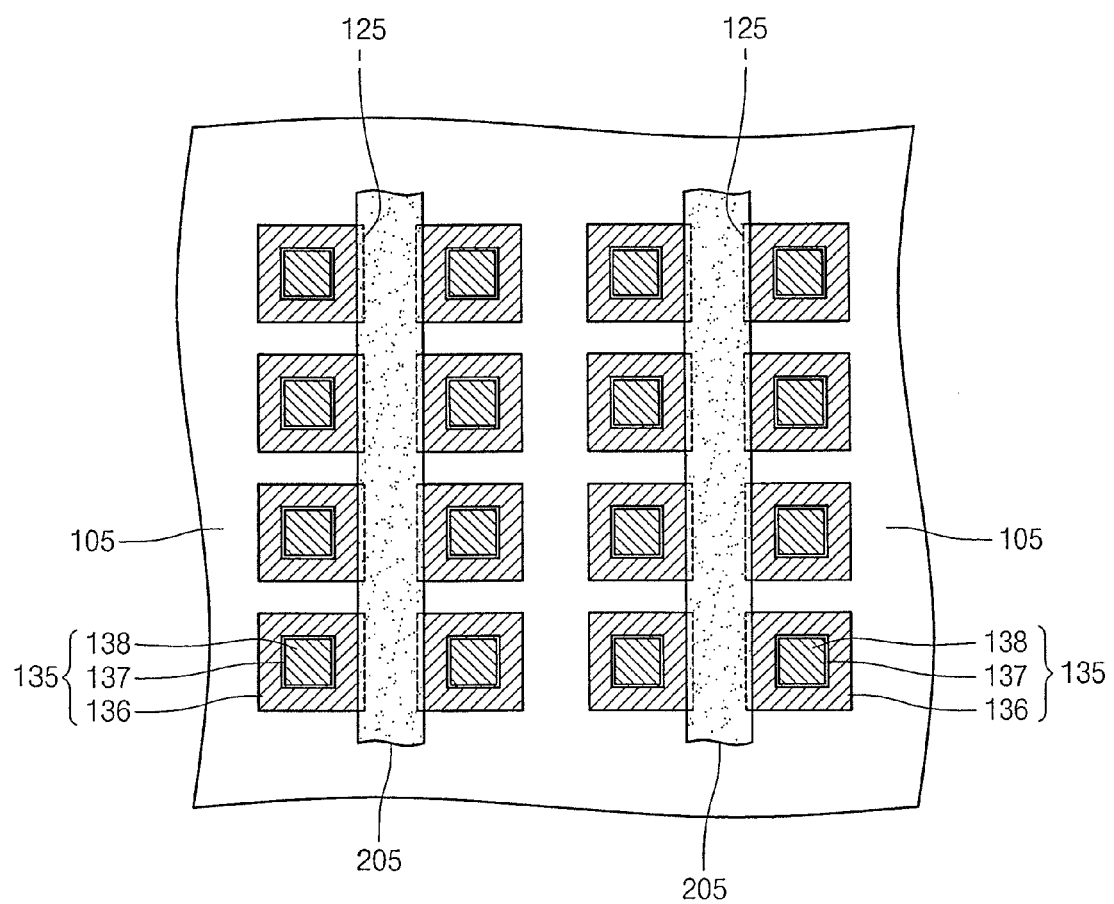

Referring to FIGS. 8A and 8B, gate patterns 135 filling the recessed gate regions 203' are formed by planarizing the gate conductive layer 130 until the mask pattern 215 and the device isolation pattern 105 are exposed.

According to an embodiment of the present invention, to substantially prevent etch damage in the channel region 201, the planarization process is performed to an extent that the mask pattern 215 is not removed. Preferably, the planarization process is performed using a chemical mechanical polishing (CMP).

Each of the gate patterns 135 is formed of a floating gate pattern 136, a gate interlayer insulating pattern 137, and a control gate pattern 138, which are stacked in sequence. The gate interlayer insulating pattern 137 is formed to contact with the side and bottom of the control gate pattern 138, and the floating gate pattern 136 is formed to contact with the outer side and bottom of the gate interlayer insulating pattern 137. The floating gate pattern 136 is surrounded by the device isolation pattern 105 and the gate insulating pattern 125. The gate insulating pattern 125 is interposed between the floating gate pattern 136 and the channel region 201, and between the floating gate pattern 136 and the semiconductor substrate 100.

Figure 9A:
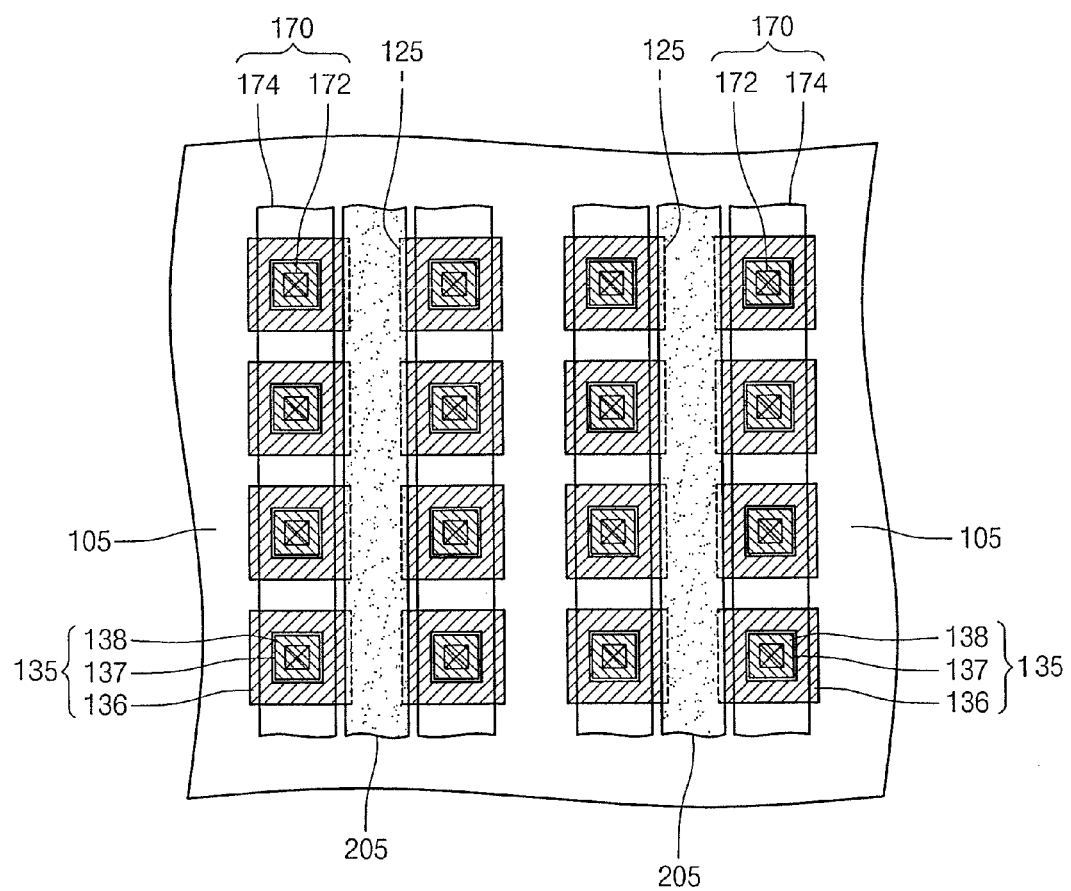
Figure 9B:
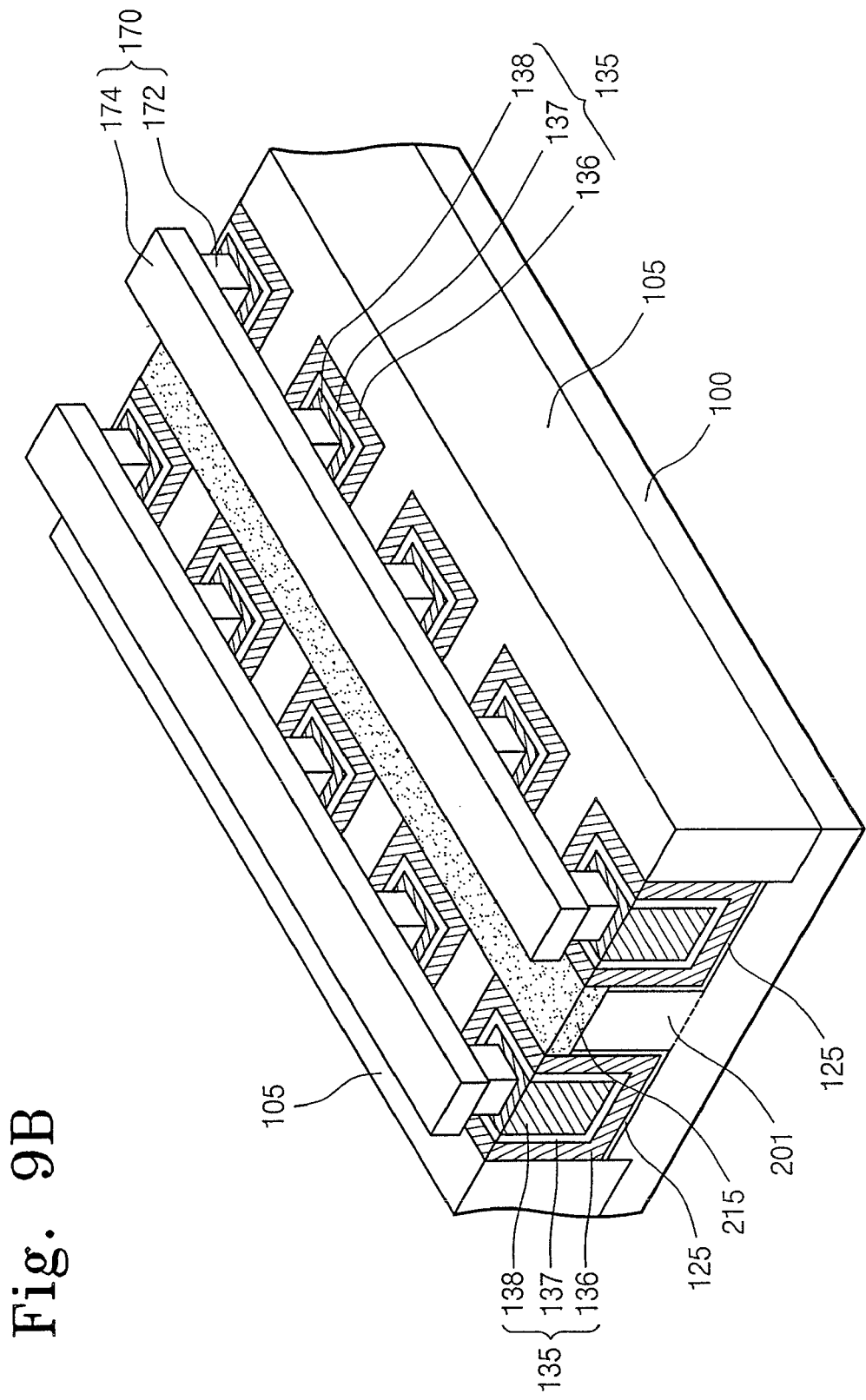

Referring to FIGS. 9A and 9B, a lower interlayer insulating layer (162 in FIGS. 1B and 1C) is formed on the resultant structure, in which the gate patterns 135 are formed, and is patterned to form gate contact holes exposing the upper portions of the gate patterns 135. Lower interconnections 170 are formed to contact with the gate patterns 135 through the gate contact holes.

The lower interconnections 170 are preferably formed of a metallic material. For example, the lower interconnections 170 can be formed of at least one of aluminum, copper, and tungsten.

According to an embodiment of the present invention, the lower interconnections 170 include gate plugs 172 filling the gate contact holes, and gate lines 174 connecting the gate plugs 172. According to another embodiment of the present invention, when the lower interlayer insulating layer is sufficiently thin, the lower interconnections 170 can be formed by a wiring process. In the case wherein the wiring process is implemented, the gate plugs 172 and the gate lines 174 are simultaneously formed as one body.

In the flash memory device according to an embodiment of the present invention, the lower interconnections 170 (specifically, the gate plugs 172) are connected to the control gate pattern 138. The floating gate pattern 136 is electrically isolated by the device isolation pattern 105, the gate insulating pattern 125, and the lower interlayer insulating layer.

In addition, the gate patterns 135 disposed on both sides of the active pattern 205 are connected together by different lower interconnections 170. The lower interconnection 170 for connecting the gate patterns 135 arranged at one side of the active pattern 205 are electrically isolated from the lower interconnection 170 for connecting the gate patterns 135 arranged at the other side of the active pattern 205. The lower interconnections 170, as shown in FIG. 9B, are arranged over the isolation pattern interposed between the gate patterns 135 and parallel with the mask pattern 215.

Referring to FIGS. 10A and 10B, the upper interlayer insulating layer (see 164 of FIGS. 1B and 1C) is formed on the resultant structure including the upper interconnections 170. The upper interlayer insulating layer is patterned to form the source/drain contact holes (see 168 of FIG. 11) in connection regions 202. The source/drain electrode (see 150 of FIG. 11) is formed at the connection regions 202 that are exposed by the source/drain contact holes 168.

Preferably, the source/drain electrode 150 is a doped region containing impurities having a different conductivity type with the channel region 201. The source/drain electrode 150 may be formed by ion implantation process using the upper interlayer insulating layer 164 as an ion implantation mask.

Upper interconnections 180 connected to the source/drain electrode 150 are formed. It is preferable that the upper interconnections 180 are formed of metallic materials having low resistivity. According to an embodiment of the present invention, the upper interconnections 180 are constituted by source/drain lines 184 and contact plugs 182 filling the source/drain contact holes 168.

Figure 11:
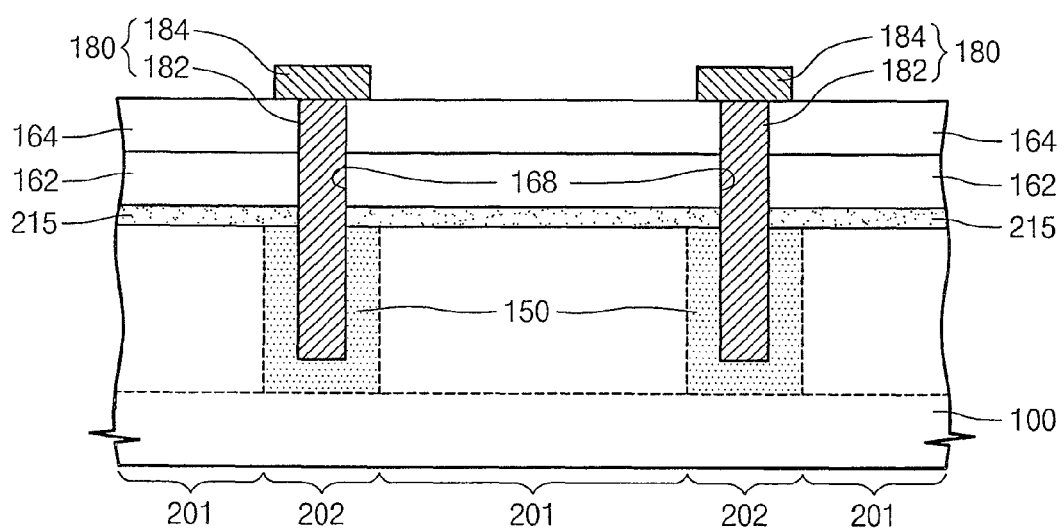
FIG. 11 is a sectional view illustrating a process of fabricating a semiconductor device according to an embodiment of the present invention.

FIG. 11 is a sectional view taken along a dotted line V-V' in FIG. 10A, showing is a process of forming the source/drain electrodes 150 according to a modified embodiment of the present invention.

Referring to FIG. 11, the forming of the source/drain electrodes 150 can further include forming the contact holes of a predetermined depth in the connection regions 202 and implanting impurities into the inner sidewalls of the connection regions 202 exposed through the contact holes. The contact holes are formed by means of an anisotropic etching process that etches the connection regions 202 exposed through the source/drain contact holes 168. The upper interlay insulating layer 164 is used as an etch mask for defining the contact holes 168, in the anisotropic etching process.

According to an embodiment of the present invention, the implanting of the impurities can be performed by an ion implantation process or a diffusion process. Preferably, the implanting of the impurities can include filling the contact holes 168 with a doped polysilicon plug. The impurities contained in the polysilicon plug are diffused to form impurity regions forming the source/drain electrodes 150. As shown in FIG. 11, the polysilicon plug can substitute for the contact plug 182 constituting the upper interconnection 180.

Figure 12:
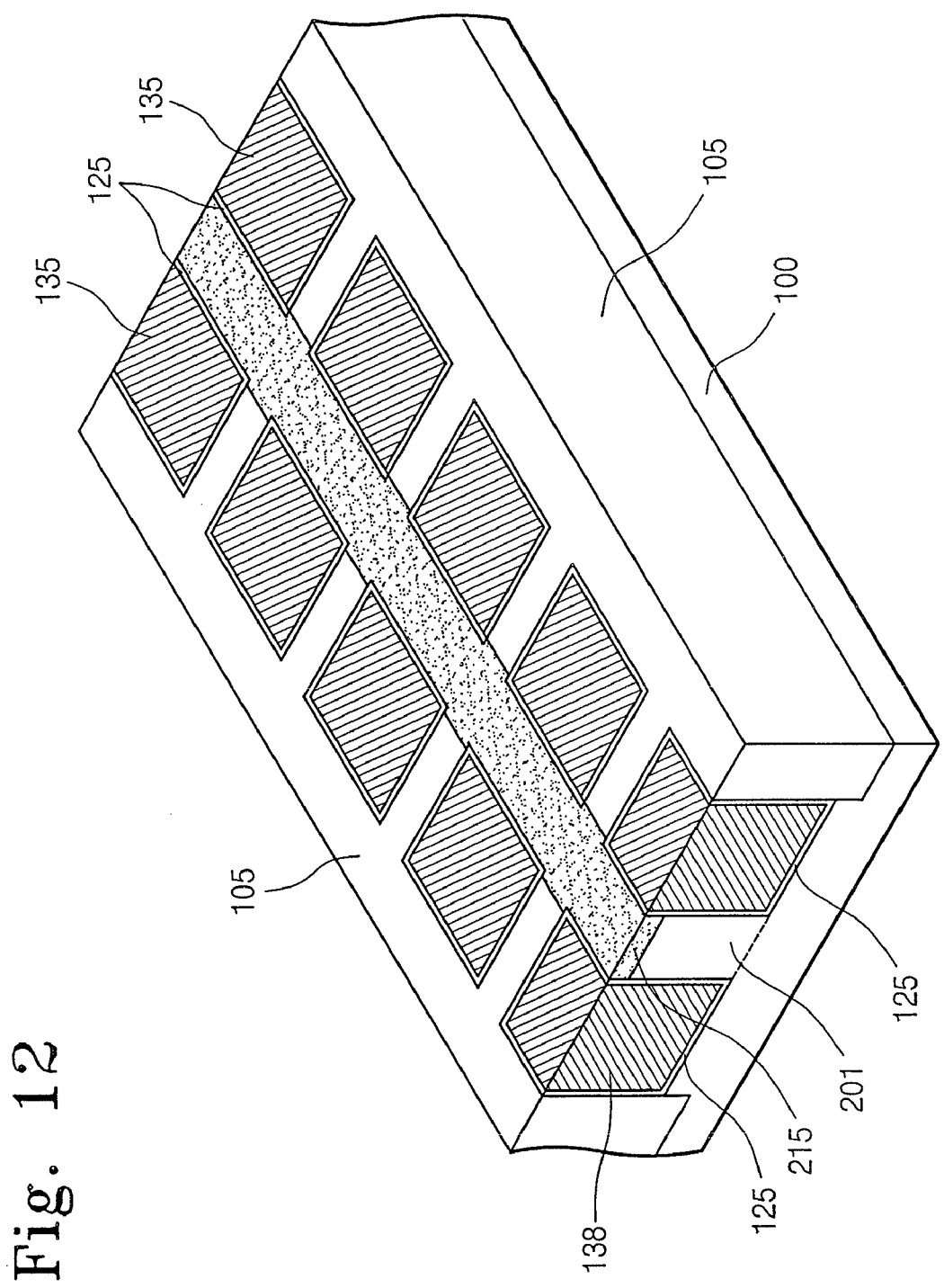
FIG. 12 is a perspective view illustrating a process of fabricating a semiconductor device according to another embodiment of the present invention.

FIG. 12 is a perspective view illustrating a process of fabricating a semiconductor device according to another modified embodiment of the present invention, and more specifically, a method of fabricating a floating-trap type flash memory.

Referring to FIG. 12, the gate insulating pattern 125, which has been described with reference to FIGS. 6A and 6B, can be formed using a CVD process. The gate insulating pattern 125 can be formed of at least one of a silicon oxide layer, a silicon nitride layer, and a high-k dielectric layer. A thermal treatment can be further performed so as to substantially remedy any etch damage to the channel region 201.

In the floating-trap type floating memory, the gate insulating pattern 125 can be formed in a stack structure of a silicon oxide layer, a silicon nitride layer, and a silicon oxide layer. The silicon nitride layer can be used as a data storage structure because it has trap sites.

The material layer formed using a CVD process is formed on an entire surface of the resultant structure, and the gate insulating pattern 125 can be formed between the device isolation pattern 105 and the gate pattern 135, and between the mask pattern 215 and the gate pattern 135.

Figure 13:
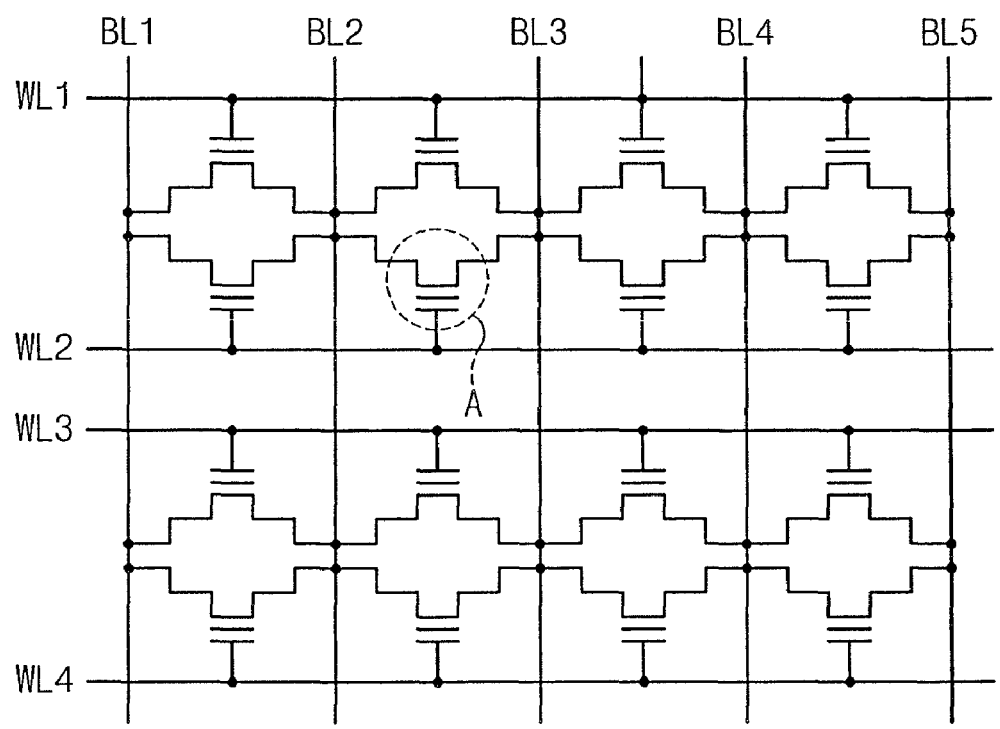
FIG. 13 is a circuit diagram of a flash memory according to the present invention.

FIG. 13 is a circuit diagram of a cell array of a flash memory according to an embodiment of the present invention.

Referring to FIG. 13, source/drain electrodes of cell transistors are connected by a plurality of bit lines BL1, BL2, BL3, BL4 and BL5. The bit lines BL1, BL2, BL3, BL4 and BL5 are arranged to cross a plurality of word lines WL1, WL2, WL3 and WL4. The word lines WL1, WL2, WL3 and WL4 connect gate electrodes of the cell transistors.

According to an embodiment of the present invention, the cell transistor of the flash memory is programmed by hot carrier injection and is erased by Fowler Nordheim (FN) tunneling. More specifically, assuming that a cell transistor A is selected by the second word line WL2, the second bit line BL2, and the third bit line BL3, the program voltage ($V_{PGM}$) is applied to the selected word line WL2, while the ground voltage is applied to the unselected word lines WL1, WL3 and WL4. The ground voltage is applied to the first and second bit lines BL1 and BL2, and a drain voltage $V_D$ is applied to the third to fifth bit lines BL3, BL4 and BL5. It is preferable that the program voltage ($V_{PGM}$) is about 12 V and the drain voltage ($V_D$) is about 5 V.

In an erase operation, the ground voltage is applied to the selected word line WL2, the erase voltage ($V_{ERASE}$) is applied to a bulk substrate, and the bit lines BL1, BL2, BL3, BL4 and BL5 are electrically floated. Here, the erase voltage ($V_{ERASE}$) may be also applied to the unselected word lines WL1, WL3 and WL4 to substantially prevent data stored in the unselected cells from being erased. The erase voltage ($V_{ERASE}$) may be in the range from about 15 V to about 20 V.

In a read operation, the read voltage ($V_{READ}$) is applied to the selected word line WL2, and the ground voltage and the drain voltage ($V_D$) are applied to the bit lines BL2 and BL3 corresponding to the source and drain electrodes, respectively. The read voltage ($V_{READ}$) may be in the range from about 1 V to about 3 V, and the drain voltage ($V_D$) may be in the range of about 0.1 V to 1 V.

According to another embodiment of the present invention, the cell transistor of the flash memory can be programmed using FN tunneling. In the case wherein FN tunneling is used, the program voltage ($V_{PGM}$) is applied to the selected word line WL2, and the ground voltage is applied to the second and third bit lines BL2 and BL3 and the bulk substrate. A predetermined drain voltage ($V_D$) is applied to the bit lines BL1, BL4 and BL5 connected with the unselected cell transistors so as to substantially prevent the unselected cell transistors from being programmed by the program voltage ($V_{PGM}$)

applied to the selected word line WL2. The erase voltage ($V_{ERASE}$) may be in the range from about 15 V to about 20 V.

The operating method and operation conditions of the cell transistor in the flash memory can be modified in various manners, considering configurations of the transistor structure and the interconnection structure.

Figure 14A:
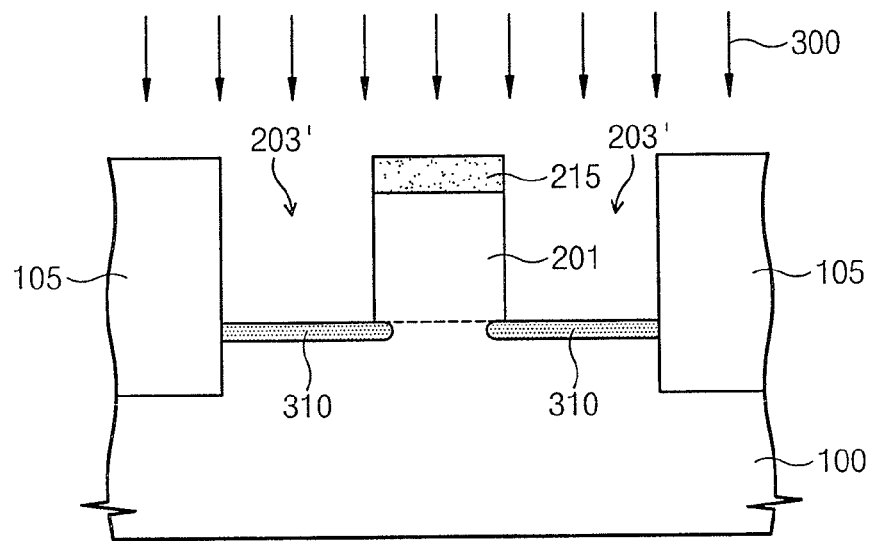
FIGS. 14A to 14D are sectional views illustrating a process of fabricating the flash memory shown in FIG. 13.

FIGS. 14A to 14D are sectional views taken along line II-II' of FIG. 1A, showing a process of fabricating the flash memory according to an embodiment of the present invention. Referring to FIG. 14A, after forming the recessed gate region 203' (refer to FIGS. 6A and 6B), a lower impurity region 310 is formed in the semiconductor substrate 100 exposed through the recessed gate region 203'. Specifically, the lower impurity region 310 is formed in a lower portion of the recessed gate region 203' and has a conductivity type the same as that of the semiconductor substrate 100. Accordingly, the semiconductor substrate 100 in which the lower impurity region 310 is formed has a higher threshold voltage than that of the channel region 201.

Due to the difference of the threshold voltages, the channel of the transistor according to an embodiment of the present invention is confined to the channel region 201. When the gate voltage applied to the gate electrode (the gate pattern 135) of the transistor is in the range between the threshold voltage of the channel region 201 and the threshold voltage of the lower impurity region 310, a channel (an electrical path through which electric charges can flow) is not formed in the semiconductor substrate 100 below the recessed gate region 203', that is, the lower impurity region 310. Given that the confinement of the region used as the channel reduces the variation in a turn-on current of the transistor, the read operation characteristic of the transistor can be improved from that of the structure described with respect to FIGS. 6A and 6B.

The forming of the lower impurity region 310 can include a first ion implantation process 300. The photoresist pattern, which was used as the etch mask in the etching process of forming the recessed gate region 203', can be used as an ion mask in the first ion implantation process 300. According to another embodiment of the present invention, after the photoresist pattern is removed, the device isolation pattern 105 and the mask pattern 215 may be used as the ion mask.

Figure 14B:
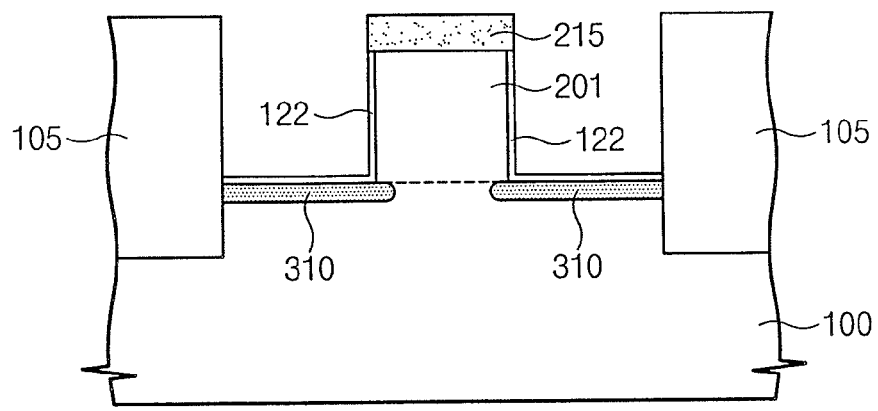

Referring to FIG. 14B, auxiliary gate insulating layers 122 are formed to cover the sidewalls of the channel region 201 and the lower impurity region 310. The auxiliary gate insulating layers 122 may be formed using a thermal oxidation process performed on the resultant structure in which the lower impurity regions 310 are formed.

According to another embodiment of the present invention, the auxiliary gate insulating layer 122 can be one of a silicon oxide layer, a silicon nitride layer, or a high-k dielectric layer, which are formed by a CVD process. Methods described with reference to FIG. 12 can also be applied here.

According to a further embodiment of the present invention, after the auxiliary gate insulating layer 122 is formed, the lower impurity region 310 can be formed. Where the lower impurity region 310 is formed after the auxiliary gate insulating layer 122, the auxiliary gate insulating layer 122 may be used for reducing ion channeling in the first ion implantation process 300.

Figure 14C:
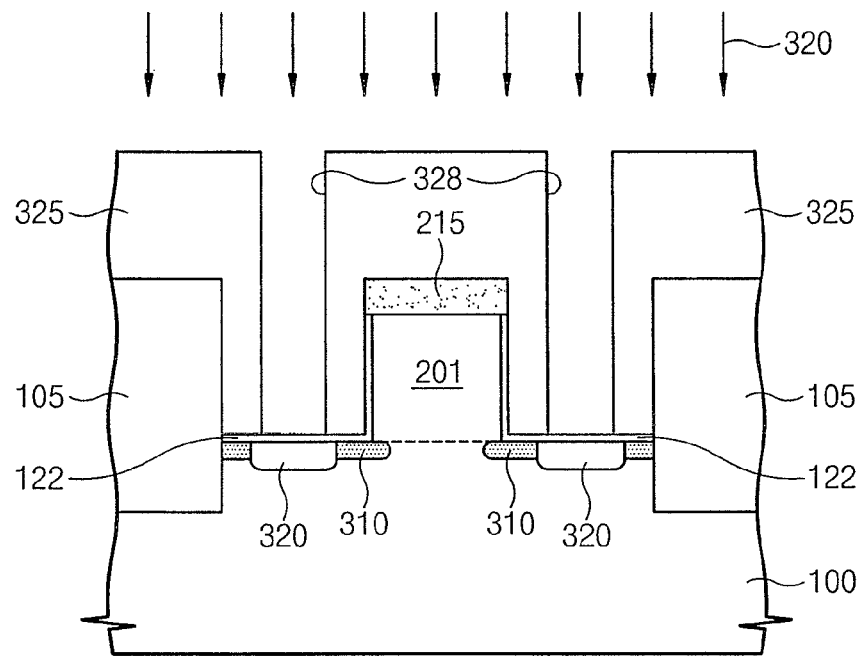

Referring to FIG. 14C, photoresist patterns 325 are formed on the resultant structure in which the auxiliary gate insulating layer 122 is formed. The photoresist patterns 325 have openings 328 exposing a portion of the top surface of the auxiliary gate insulating layer 122. Preferably, the openings 328 expose the top surface of the auxiliary gate insulating layer 122 in a center of the recessed gate region 203'. A second ion implantation process 320 is performed using the photoresist patterns 325 as an ion implantation mask. A tunnel impurity region 320 is formed by the second ion implantation process 320 in the semiconductor substrate 100 disposed below the openings 328. The tunnel impurity region 320 can have a conductivity type different from that of the semiconductor substrate 100 and the lower impurity region 310. The tunnel impurity region 320 has a higher impurity concentration than that of the lower impurity region 310.

Figure 15:
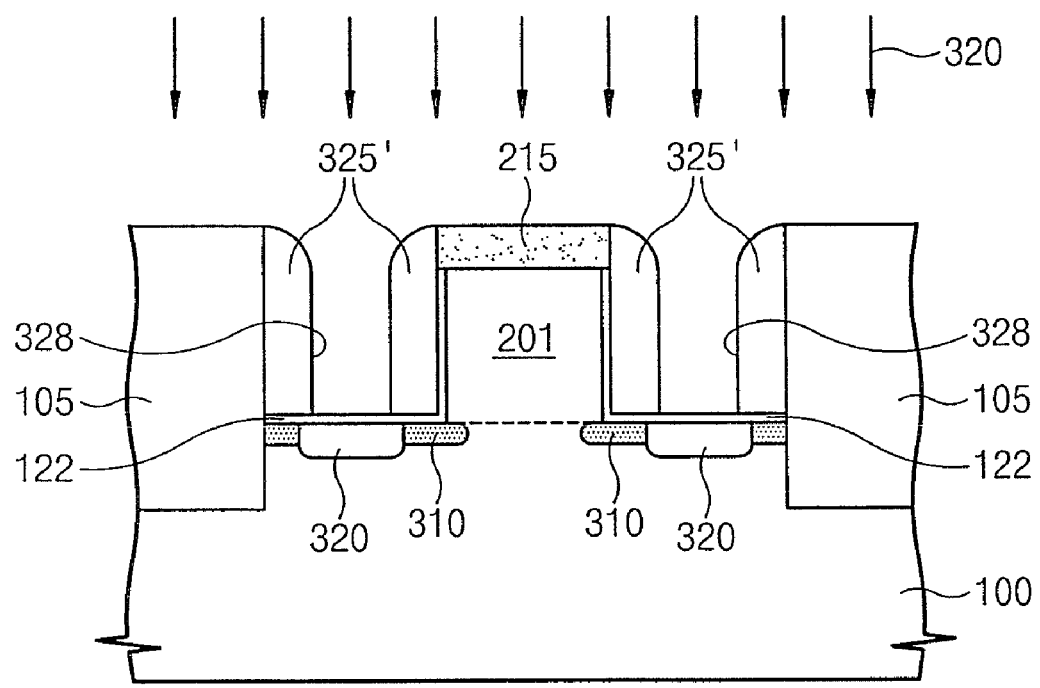
FIG. 15 is a sectional view illustrating a process of fabricating a flash memory according to an embodiment of the present invention.

According to a further embodiment of the present invention, a predetermined spacer 325' can substitute for the photoresist pattern 325 (refer to FIG. 15). The forming of the spacer 325' includes forming a spacer layer on the resultant structure in which the auxiliary gate insulating layer 122 is formed, and etching the spacer layer by anisotrophic etching. It is preferable that the spacer layer is formed of a material with an etch selectivity with respect to the auxiliary gate insulating layer 122 and the device isolation pattern 105. For example, the spacer layer can be a silicon nitride layer or a silicon oxynitride layer. In addition, the anisotrophic etching of the spacer layer is performed until the auxiliary gate insulating layer 122 is exposed from the bottom of the recessed gate region 203', thereby forming the spacer 325' with the openings 328.

Figure 14D:
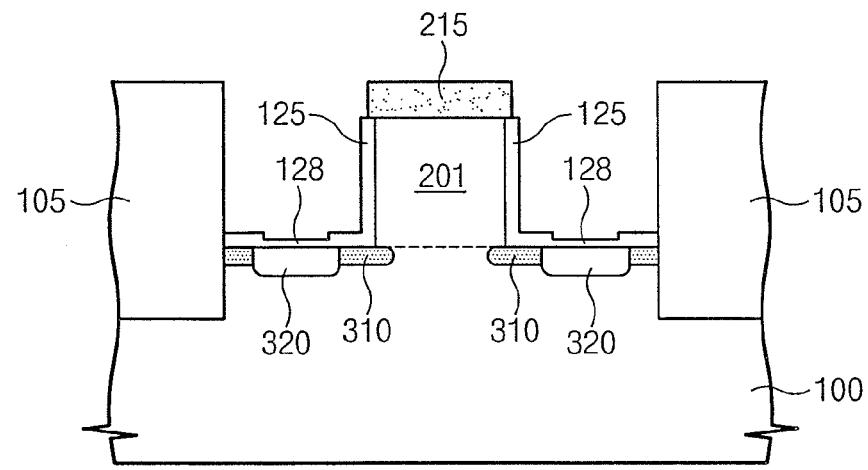

Referring to FIGS. 14C and 14D, the auxiliary gate insulating layer 122 is etched using the photoresist pattern 325 or the spacer 325' as an etch mask. Accordingly, a tunnel region is formed to exposes the top surface of the semiconductor substrate 100, and more specifically, the top surface of the tunnel impurity region 320.

The photoresist pattern 325 or the spacer 325' is removed and a tunnel insulating layer 128 is formed in the tunnel region. The tunnel insulating layer 128 may be formed by a thermal oxidation process. When using the thermal oxidation process, the channel region 201 and the semiconductor substrate 100 covered with the auxiliary gate insulating layer 122 are also oxidized. As illustrated in FIG. 14D, the thickness of the auxiliary gate insulating layer 122 increases to thereby form the gate insulating pattern 125. The gate insulating pattern 125 is thicker than the tunnel insulating layer 128.

According to a further embodiment of the present invention, the tunnel insulating layer 128 can be one of a silicon oxide layer, a silicon nitride layer, and a high-k dielectric layer, each of which may be formed using a CVD process. The method described above with reference to FIG. 12 can also be applied here.

A gate conductive layer 130 filling the recessed gate region 203' is formed on the resultant structure in which the tunnel insulating layer 128 and the gate insulating pattern 125 are formed (refer to FIGS. 7B and 14A). Embodiments described in association with the flash memory can also be applied to the process of forming the gate conductive layer 130 and the subsequent processes (refer to FIGS. 4 to 11).

According to embodiments described above with reference to FIGS. 14A to 14D and 15, the gate insulating pattern 125 is interposed between the channel region 201 and the gate pattern 135, and the tunnel insulating layer 128 is interposed between the tunnel impurity region 320 and the gate pattern 135. Since the tunnel insulating layer 128 is thinner than the gate insulating pattern 125, the flash memory according to an embodiment of the present invention can efficiently perform the write operation. The efficiency of the write operation is directly related to the probability of FN tunneling, which increases as the insulating layer becomes thinner. The cell transistor of the flash memory is programmed by hot carrier injection and is erased by FN tunneling. It is preferable that the erase operation uses the voltage difference between the semiconductor substrate 100 and the control gate pattern 138.

The efficiency of the write operation can be increased by controlling the impurity concentration of the tunnel impurity region 320 foamed below the tunnel insulating layer 128.

According to an embodiment of the present invention, one semiconductor pattern can be shared as the channel region of two transistors. Moreover, one impurity region can be shared as the source/drain electrodes of two or four transistors. Accordingly, the degree of integration of the semiconductor device can be increased.

Since the gate electrode of the transistor is disposed on the side of the channel, the channel width of the transistor can be increased by increasing the depth of the recessed gate region (e.g., the height of the channel region). By increasing the depth of the recessed gate region, the degree of integration of the semiconductor device can be increased without reducing the channel width of the transistor and the characteristics of the transistor can be improved while increasing the degree of integration of the semiconductor device.

According to an embodiment of the present invention, the gate insulating pattern is interposed between the gate pattern and the channel region, and the tunnel insulating layer is interposed between the gate pattern and the semiconductor substrate. In the flash memory, the channel region for the read operation is spatially separated from the tunnel region for the write operation and the characteristics of the read operation and the write operation can be improved independently. For example, for the purpose of the efficient write operation, the tunnel insulating layer can be formed to be thinner than the gate insulating pattern. The efficiency of the write operation can be improved by controlling the conductivity type and concentration of the impurity region formed below the tunnel insulating layer and in the flash memory, both the read operation and the write operation can be improved.

It will be apparent to those skilled in the art that various modifications and variations can be made in the present invention. Thus, it is intended that the present invention covers the modifications and variations of this disclosure.

What is claimed is:

1. A method of fabricating a semiconductor device, comprising:
    forming a plurality of device isolation patterns in a predetermined region of a semiconductor substrate to define an auxiliary active pattern, the auxiliary active pattern including a plurality of channel regions, a plurality of connection regions, each connection regions being disposed between a respective pair the channel regions, and a plurality of gate regions, wherein respective gates regions are disposed on at least two sides of each of the channel regions;
    forming an active pattern comprising the plurality of channel regions and the plurality of connection regions by recessing the plurality of gate regions of the auxiliary active pattern such that top surfaces of the plurality of gate regions are lower than the plurality of channel regions;
    forming a gate insulating layer covering sidewalls of the active pattern;
    forming a gate pattern on the at least two sides of each channel region, the gate pattern filling a plurality of recessed gate regions in which the gate insulating layer is formed; and
    forming a plurality of source/drain electrodes, each source/drain electrode formed in a respective connection region of the active pattern.

2. The method of claim 1, wherein the forming of a device isolation pattern of the plurality of device isolation patterns comprises:
    forming a mask layer on the semiconductor substrate;
    patterning the mask layer and the semiconductor substrate to form a device isolation trench defining the auxiliary active pattern;
    forming a device isolation layer filling the device isolation trench; and
    planarizing the device isolation layer until the mask layer is exposed, the mask layer being formed of at least one layer selected from the group consisting of a silicon oxide layer, a silicon nitride layer, a silicon oxynitride layer, and a silicon layer.

3. The method of claim 1, wherein the forming of the active pattern comprises:
    forming a mask pattern to cover the active pattern and expose an upper portion of the plurality of gate regions; and
    etching, anisotropically, the plurality of gate regions using the mask pattern as an etch mask to form the plurality of recessed gate regions exposing the sidewalls of the active pattern,
    wherein the etching of the plurality of gate regions is performed using an etch having etch selectivity with respect to the mask pattern and the plurality of device isolation patterns.

4. The method of claim 1, wherein the forming of the gate insulating layer comprises performing a thermal oxidation process to form a silicon oxide layer on a bottom portion of the plurality of recessed gate regions and exposed sidewalls of the active pattern.

5. The method of claim 1, wherein the forming of the gate insulating layer comprises performing a CVD (chemical vapor deposition) process to form at least one of a silicon oxide layer, a silicon nitride layer, or a high-k dielectric layer on an entire surface of a resultant structure in which the active pattern is formed.

6. The method of claim 1, wherein the forming of the plurality of gate patterns comprises:
    forming a gate conductive layer filling the plurality of recessed gate regions on a resultant structure including the gate insulating layer; and
    planarizing the gate conductive layer until an upper portion of the plurality of device isolation patterns is exposed, thereby forming the plurality of gate patterns disposed on the at least two sides of each of the channel regions.

7. The method of claim 6, wherein the gate conductive layer is formed of at least one material selected from the group consisting of polysilicon, copper, aluminum, tungsten, tantalum, titanium, tungsten nitride, tantalum nitride, titanium nitride, tungsten silicide, and cobalt silicide.

8. The method of claim 1, wherein the forming of the plurality of gate patterns comprises:
    filling the plurality of recessed gate regions by sequentially forming a floating gate conductive layer, a gate interlayer insulating layer, and a control gate conductive layer on a resultant structure in which the gate insulating layer is formed; and
    planarizing the control gate conductive layer, the gate interlayer insulating layer, and the floating gate conductive layer until an upper portion of the plurality of device isolation patterns is exposed, thereby forming a floating gate pattern, a gate interlayer insulating pattern, and a control gate pattern to fill the plurality of recessed gate regions.

9. The method of claim 1, further comprising, after forming the plurality of gate patterns, forming a lower interconnection to connect the gate patterns, wherein the forming of the lower interconnection comprises:

forming a plurality of gate plugs connected to the plurality of gate patterns, respectively; and forming a gate line in a direction parallel to the active pattern to connect the plurality of gate plugs together.

10. The method of claim 8, further comprising, after forming the plurality of gate patterns, forming a lower interconnection to connect the plurality of gate patterns together, wherein the forming of the lower interconnection comprises:

forming a plurality of gate plugs connected to the control gate pattern; and forming the plurality of gate lines in a direction substantially parallel to the active pattern to connect the plurality of gate plugs together.

11. The method of claim 9, further comprising, before forming the plurality of gate lines, forming a local interconnection to connect the plurality of gate plugs connected to a pair of the plurality of gate patterns disposed in on opposite sides of a respective one of the plurality of channel regions.

12. The method of claim 1, wherein the forming of the plurality of source/drain electrodes comprises forming an impurity region of a conductivity type different from that of the semiconductor substrate in a respective one of the plurality of connection regions of the semiconductor substrate.

13. The method of claim 12, wherein the forming each of the plurality of source/drain electrodes comprises:

etching a predetermined portion of a respective one of the plurality of connection regions to form a contact hole of a predetermined depth in the respective connection region; and forming an impurity region of a conductivity type different from that of the semiconductor substrate on inner walls of the respective connection region exposed through the contact hole.

14. The method of claim 9, further comprising, after forming the plurality of source/drain electrodes, forming an upper interconnection to cross the lower interconnection and connect the source/drain electrodes.

15. The method of claim 9, further comprising, after forming the plurality of source/drain electrodes:

forming an upper interconnection to cross the lower interconnection and connect a first group of the source/drain electrodes; and forming a data storage structure electrically connected to a second group of source/drain electrodes that are not connected by the upper interconnection, the data storage structure being one of a DRAM capacitor, a magnetic tunnel junction (MTJ), a ferroelectric capacitor, and a phase-change resistor.

16. The method of claim 1, further comprising, after forming the active pattern, forming a lower impurity region in the semiconductor substrate below the plurality of recessed gate region, wherein the lower impurity region has a conductivity type of the semiconductor substrate.

17. The method of claim 1, wherein the forming of the gate insulating layer includes:

forming an auxiliary gate insulating layer on a bottom portion of the plurality of recessed gate regions and exposed sidewalls of the active pattern;

forming a mask pattern having openings exposing an upper portion of the auxiliary gate insulating layer in a center of the plurality of recessed gate regions;

forming a tunnel region to expose an upper portion of the semiconductor substrate by etching an exposed auxiliary gate insulating layer using the mask pattern as an etch mask;

removing the mask pattern to expose the auxiliary gate insulating layer; and forming a tunnel insulating layer in the tunnel region, the tunnel insulating layer being thinner than the gate insulating layer.

18. The method of claim 17, wherein the forming of the tunnel insulating layer is performed using one of a thermal oxidation process or a CVD process.

19. The method of claim 17, wherein the mask pattern is a photoresist pattern formed by a photolithography process and an etching process, or a spacer formed by a deposition process and an anisotropic etching process.

* * * * *